United States Patent
Khusnatdinov

(10) Patent No.: US 11,402,749 B2
(45) Date of Patent: Aug. 2, 2022

(54) DROP PATTERN CORRECTION FOR NANO-FABRICATION

(71) Applicant: CANON KABUSHIKI KAISHA, Tokyo (JP)

(72) Inventor: Niyaz Khusnatdinov, Round Rock, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 263 days.

(21) Appl. No.: 16/446,257

(22) Filed: Jun. 19, 2019

(65) Prior Publication Data

US 2020/0401040 A1    Dec. 24, 2020

(51) Int. Cl.
  *G03F 7/00* (2006.01)
  *H01L 21/027* (2006.01)

(52) U.S. Cl.
  CPC ........ *G03F 7/0002* (2013.01); *H01L 21/0271* (2013.01)

(58) Field of Classification Search
  CPC ............................ G03F 7/0002; H01L 21/0271
  See application file for complete search history.

(56) References Cited

U.S. PATENT DOCUMENTS

| | | | |
|---|---|---|---|
| 6,936,194 B2 | 8/2005 | Watts | |
| 7,157,036 B2 | 1/2007 | Choi et al. | |
| 8,066,930 B2 | 11/2011 | Sreenivasan et al. | |
| 8,076,386 B2 | 12/2011 | Xu et al. | |
| 8,119,052 B2 | 2/2012 | Schumaker | |
| 8,349,241 B2 | 1/2013 | Sreenivasan et al. | |
| 8,512,797 B2 | 8/2013 | Schumaker | |
| 8,586,126 B2 | 11/2013 | Schumaker | |
| 8,691,123 B2 | 4/2014 | Nakagawa et al. | |
| 9,176,376 B2 | 11/2015 | Mataki | |
| 9,381,540 B2 | 7/2016 | Koshiba et al. | |
| 9,415,418 B2 | 8/2016 | Sreenivasan et al. | |
| 9,718,096 B2 | 8/2017 | Sreenivasan et al. | |
| 10,029,456 B2 | 7/2018 | Nakagawa et al. | |
| 2005/0051698 A1* | 3/2005 | Sreenivasan | B82Y 40/00 249/135 |
| 2010/0101493 A1 | 4/2010 | Hodge et al. | |
| 2013/0249981 A1* | 9/2013 | Nakagawa | B29C 43/021 347/9 |
| 2017/0140922 A1 | 5/2017 | Iwasaki et al. | |

FOREIGN PATENT DOCUMENTS

JP    2018133379 A    8/2018

* cited by examiner

*Primary Examiner* — James M Mellott
(74) *Attorney, Agent, or Firm* — Canon U.S.A., Inc., IP Division

(57) ABSTRACT

A preliminary drop pattern is provided that defines a predetermined location on a substrate for a center of mass of each drop of a plurality of drops. The preliminary drop pattern is adjusted to generate an adjusted drop pattern by radially shifting each drop of a subset of drops of the plurality of drops from the predetermined location by a radial offset. The plurality of drops is dispensed according to the adjusted drop pattern. A template or a superstrate is contacted with the dispensed drops, after which the center of mass of each drop of the subset of drops is radially displaced to a displaced location on the substrate prior to the plurality of drops forming a continuous layer. The radial offset is selected such that the displaced location is within 50 μm of the predetermined location of the corresponding drop of the preliminary drop pattern.

21 Claims, 16 Drawing Sheets

DROP PATTERN CORRECTION FOR NANO-FABRICATION

BACKGROUND

Field of Art

The present disclosure relates to a drop pattern forming method for forming a drop pattern on a substrate in which the drop pattern is corrected.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The patterning process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

SUMMARY

A drop dispensing method comprises providing a preliminary drop pattern that defines a predetermined location on a substrate for a center of mass of each drop of a plurality of drop, the preliminary drop pattern having a center; adjusting the preliminary drop pattern to generate an adjusted drop pattern by radially shifting, relative to the center, each drop of a subset of drops of the plurality of drops from the predetermined location by a radial offset, each drop of the adjusted drop pattern corresponding to a drop of the preliminary drop pattern; dispensing the plurality of drops according to the adjusted drop pattern onto the substrate; and contacting a template or a superstrate with the dispensed drops, during which the center of mass of each drop of the subset of drops is radially displaced to a displaced location on the substrate prior to the plurality of drops forming a continuous layer. The radial offset of each drop of the subset of drops is selected such that the displaced location of each drop of the subset of drops is within 50 μm of the predetermined location of the corresponding drop of the preliminary drop pattern.

A method of generating a drop pattern comprises providing a preliminary drop pattern that defines a predetermined location on a substrate for a center of mass of each drop of a plurality of drops, the preliminary drop pattern having a center; and adjusting the preliminary drop pattern to generate an adjusted drop pattern by radially shifting, relative to the center, each drop of a subset of drops of the plurality of drops from the predetermined location by a radial offset, each drop of the adjusted drop pattern corresponding to a drop of the preliminary drop pattern. The radial offset of each drop of the subset of drops is selected such that when the plurality of drops is dispensed onto the substrate according to the adjusted drop pattern, and when a template or superstrate is contacted with the dispensed drops, during which the center of the mass of each drop of the subset of drops is radially displaced to a displaced location on the substrate prior to the plurality of drops forming a continuous layer, the displaced location of each drop of the subset of drops is within 50 μm of the predetermined location of the corresponding drop of the preliminary drop pattern.

A dispensing system comprises a first chuck configured to hold a template or superstrate; a second substrate chuck configured to hold a substrate; a processor configured to: access a preliminary drop pattern that defines a predetermined location on the substrate for a center of mass of each drop of a plurality of drops, the preliminary drop pattern having a center; and adjust the preliminary drop pattern to generate an adjusted drop pattern by radially shifting, relative to the center, each drop of a subset of drops of the plurality of drops from the predetermined location by a radial offset, each drop of the adjusted drop pattern corresponding to a drop of the preliminary drop pattern. The radial offset of each drop of the subset of drops is selected such that when the plurality of drops is dispensed onto the substrate according to the adjusted drop pattern, and when the template or superstrate is contacted with the dispensed drops, during which the center of the mass of each drop of the subset of drops is radially displaced to a displaced location on the substrate prior to the plurality of drops forming a continuous layer, the displaced location of each drop of the subset of drops is within 50 μm of the predetermined location of the corresponding drop of the preliminary drop pattern. The dispensing system further comprises a fluid dispenser configured to dispense formable material on the substrate in accordance with the adjusted drop pattern; a positioning system configured to contact the formable material with the template or superstrate in the template or superstrate chuck; and a curing system configured to cure the formable material under the template or superstrate so as to form cured formable material on the substrate.

A method of making an article comprises providing a preliminary drop pattern that defines a predetermined location on a substrate for a center of mass of each drop of a plurality of drop, the preliminary drop pattern having a center; adjusting the preliminary drop pattern to generate an adjusted drop pattern by radially shifting, relative to the center, each drop of a subset of drops of the plurality of drops from the predetermined location by a radial offset, each drop of the adjusted drop pattern corresponding to a drop of the preliminary drop pattern; dispensing the plurality of drops according to the adjusted drop pattern onto the substrate; contacting a template or a superstrate with the dispensed drops, during which the center of mass of each drop of the subset of drops is radially displaced to a displaced location on the substrate prior to the dispensed drops combining to form a pattern or a layer; forming the pattern or the layer of the plurality of dispensed drops on the substrate as a result of completing the contacting of the template or superstrate with the dispensed drops; and processing the formed pattern or layer to make the article. The radial offset of each drop of the subset of drops is selected such that the displaced location of each drop of the subset of drops is within 50 μm of the predetermined location of the corresponding drop of the preliminary drop pattern.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
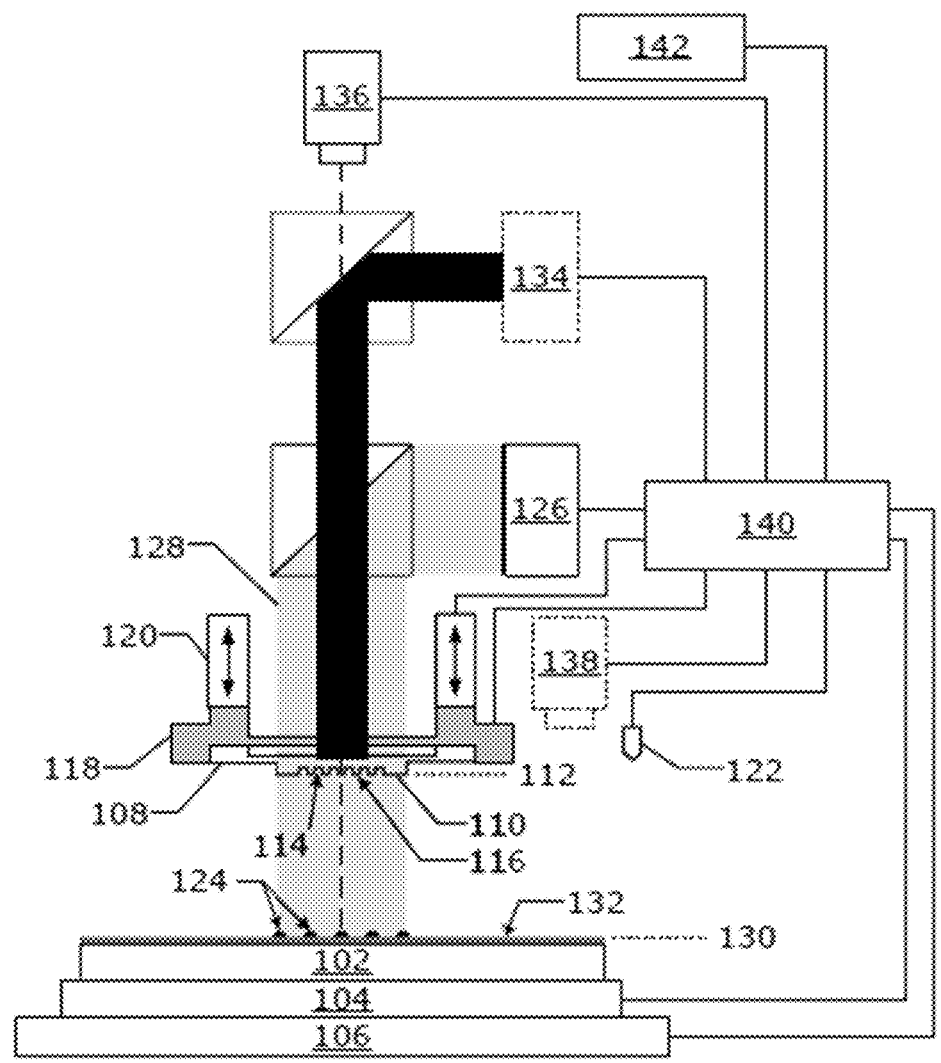
FIG. 1 is an illustration of an exemplary nanoimprint lithography system in accordance with an example embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Throughout this disclosure, reference is made primarily to nanoimprint lithography, which uses the above-mentioned patterned template to impart a pattern onto formable liquid. However, as mentioned below, in an alternative embodiment, the template is featureless in which case a planar surface may be formed on the substrate. In such embodiments where a planar surface is formed, the formation process is referred to as planarization. Thus, throughout this disclosure, whenever nanoimprint lithography is mentioned, it should be understood that the same method is applicable to planarization. The term superstrate is used in place of the term template in instances where the template is featureless.

When performing an imprinting or planarization, as will be discussed below in more detail, one of the steps includes dispensing a drop pattern of the formable material, and another step includes bringing down the template/superstrate to contact the drops of dispensed formable material. As the template/superstrate comes into contact with the drops, a plurality of forces is imparted on certain drops that causes a center of mass of the drops to be displaced just before being subsumed into a continuous fluid formed as the drops combine. One force is imparted by a gas that flows outwardly away from the center of the template/superstrate toward the perimeter of the template/superstrate. This force imparts a radially outward force on certain drops in a direction toward the perimeter of the template. Another force imparted on certain drops is a capillary force as the template/superstrate flattens into contact with the drops. The capillary force is imparted on certain drops in a direction radially inwardly toward the center of the template/superstrate. Because of these forces, the center of mass of certain drops are displaced from the initial placement to another location just before being subsumed into a continuous fluid formed as the drops combine. Accordingly, if no corrective action is taken, the ultimate location of the center of mass of certain drops are not located in the desired location just before being subsumed. Thus, with the center of mass of certain drops no longer in the desired location, the final product may have defects. Disclosed herein is a drop dispensing method that accounts for the above-described forces such that the ultimate position of the drops is at the desired location, thereby reducing or eliminating defects in the final product.

Nanoimprint System (Shaping System)

FIG. 1 is an illustration of a nanoimprint lithography system 100 in which an embodiment may be implemented. The nanoimprint lithography system 100 is used to shape a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate. In such embodiments where a planar surface is formed, the formation process may be alternatively referred to as planarization and the featureless template may be alternatively referred to as a superstrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head may include one or more actuators such as voice coil motors, piezoelectric motors, linear motor, nut and screw motor, etc, which are configured to move the template chuck 118 relative to the substrate in at least the z-axis direction, and potentially other directions (e.g. x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has made contact with the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track the progress over the imprinting process.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatial temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has made contact with the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136 and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form the planar layer with a featureless patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template/Superstrate

Figure 2:
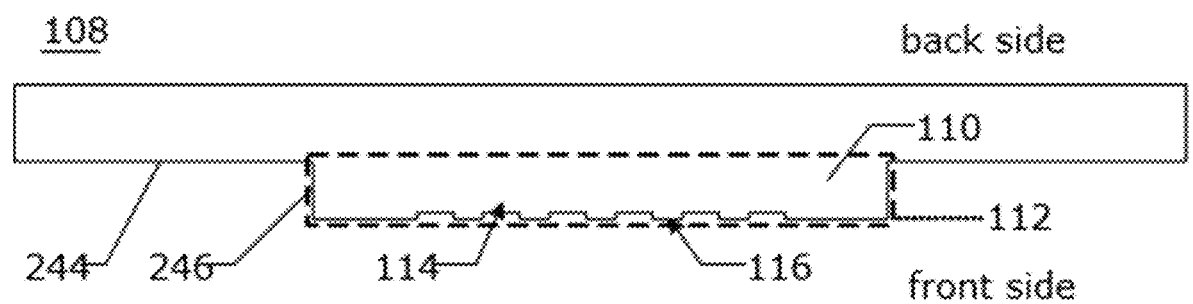
FIG. 2 is an illustration of an exemplary template in accordance with an example embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

An alternative template may be used in another embodiment, referred herein as a superstrate. In the case of the superstrate, the patterning surface 112 is featureless. That is, in an embodiment there is no pattern on the surface 112. A superstrate with no pattern is used in a planarization process. Thus, when a planarization process is performed, the superstrate is used in place of the template shown in FIG. 1.

Imprinting/Planarizing Process

Figure 3:
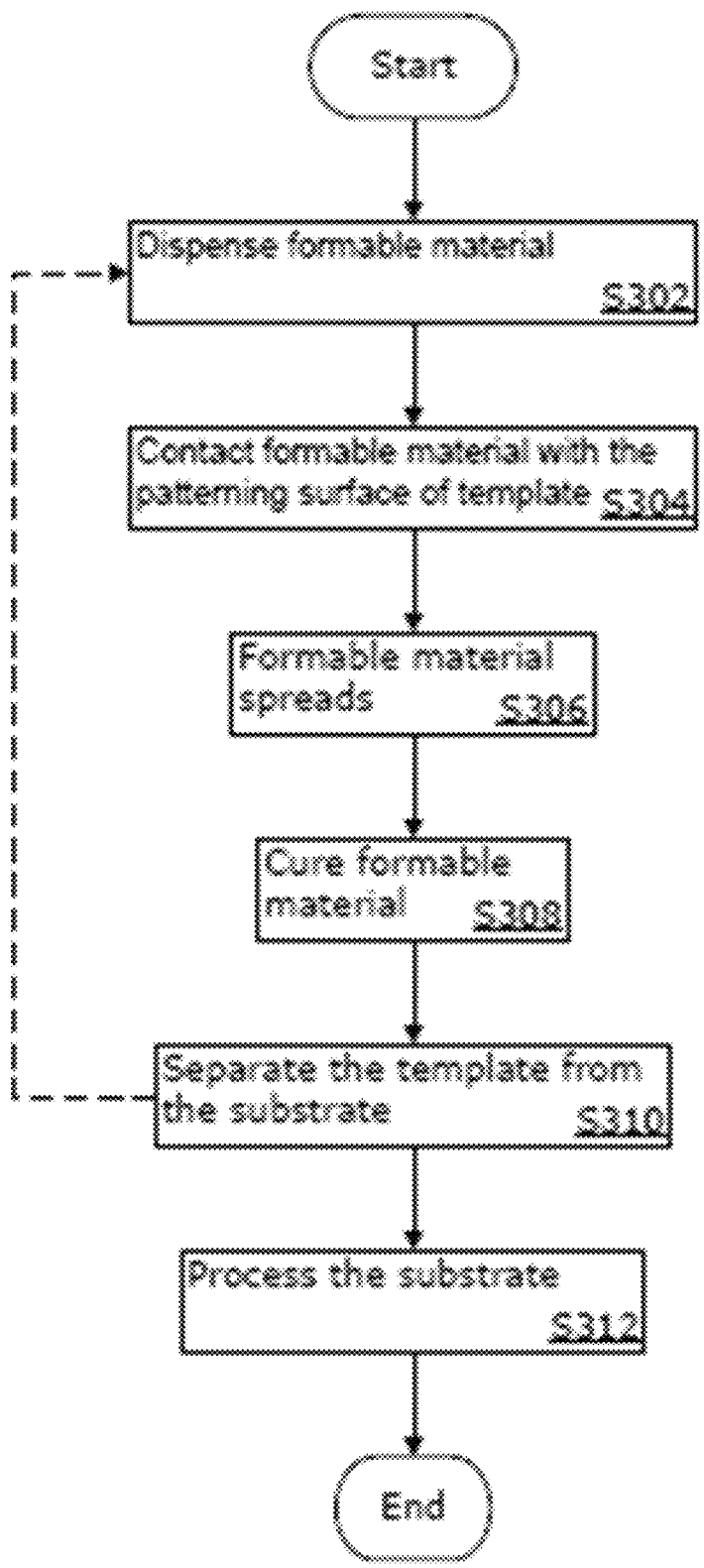
FIG. 3 is a flowchart illustrating an exemplary imprinting method in accordance with an example embodiment.

FIG. 3 is a flowchart of an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control imprinting process 300.

In an alternative embodiment, a similar process may be performed to planarize the substrate 102. In the case of planarizing, substantially the same steps discussed herein with respect to FIG. 3 are performed, except that a patternless superstrate is used in place of the template. Thus, it should be understood that the following description is also applicable to a planarizing method. When using as superstrate, the superstrate may be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprint field i (index i may be initially set to 1) of the substrate 102 to a fluid dispense position below the fluid dispenser 122. The substrate 102, may be divided into N imprint fields, wherein each imprint field is identified by an index i. In which N is a real integer such as 1, 10, 75, etc. $\{N \in \mathbb{Z}^+\}$. In a dispensing step S302, the processor 140 may cause the fluid dispenser 122 to dispense formable material onto an imprint field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102.

If there are additional imprint fields to be imprinted then the process moves back to step S302. In an embodiment, additional processing is performed on the substrate 102 in a processing step S312 so as to create an article of manufacture (e.g. semiconductor device). In an embodiment, each imprint field includes a plurality of devices.

The further processing in processing step S312 may include etching processes to transfer a relief image into the substrate that corresponds to the pattern in the patterned layer or an inverse of that pattern. The further processing in processing step S312 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Drop Pattern Generation

It is useful to deposit a plurality of drops of formable material 124 onto a substrate 102 which is then imprinted/planarized. Imprinting/planarizing may be done in a field by field basis or on a whole wafer basis. The drops of formable material 124 may also be deposited in a field by field basis or on a whole substrate basis. Even when the drops are deposited on a whole substrate basis generating the drop pattern is preferably done on a field by field basis.

Generating a drop pattern for a full field may include a processor 140 receiving a substrate pattern of a representative substrate 102, and a template pattern of a representative template 108.

The substrate pattern may include information about substrate topography of the representative substrate, a field of the representative substrate and/or a full field of the representative substrate. The substrate topography may be measured, generated based on previous fabrication steps and/or generated based on design data. In an alternative embodiment, the substrate pattern is featureless either because there were no previous fabrication steps or the substrate had previously been planarized to reduce topography. The substrate topography may include information about the shape such as a bevel, a rounding of an edge of the representative substrate. The substrate topography may include information about the shape and position of one or more flats or notches which identify the orientation of the substrate. The substrate topography may include information about a shape and position of a reference edge which surrounds the area of the substrate on which patterns are to be formed.

The template pattern may include information about the topography of the patterning surface 112 of the representative template. The topography of the patterning surface 112 may be measured and/or generated based on design data. In an alternative embodiment, the template pattern of the representative embodiment is featureless and may be used to planarize the substrate 102. The patterning surface 112 may be the same size as: an individual full field; multiple fields; the entire substrate, or larger than the substrate.

Once the substrate pattern and the template pattern are received, a processor 140 may calculate a distribution of formable material 124 that will produce a film that fills the volume between the substrate and the patterning surface when the substrate and the patterning surface are separated by a gap during imprinting. The distribution of formable material on the substrate may take the form of: an areal density of formable material; positions of droplets of formable material; and/or volume of droplets of formable material. Calculating the distribution of formable material may take into account one or more of: material properties of the formable material, material properties of the patterning surface, material properties of the substrate surface, spatial variation in volume between the patterning surface and the substrate surface; fluid flow, evaporation; etc.

Drop Dispensing Method

A drop dispensing method by the nanoimprint lithography system 100 or planarization system can be used to dispense a pattern of drops of formable material 124 onto the substrate 102. The drop dispensing method described herein solves the above-noted problem of the center of mass of certain droplets being displaced during the imprinting or planarization process.

The first step in the drop dispensing method is to provide a preliminary drop pattern. The preliminary drop pattern is the desired pattern of the drops to be dispensed onto the substrate. In other words, the preliminary drop pattern is a placement pattern that represents the predetermined ideal location of the drops on the substrate, prior to taking into account the above-noted factors that will cause the center of mass of some of the drops to be displaced during the imprinting/planarization process. More particularly, the preliminary drop pattern defines a predetermined location on a substrate for a center of mass of each droplet of a plurality of droplets. The preliminary drop pattern may have a center point, with each of the drops of the pattern being located at a radial location relative to the center point. Obtaining/generating a preliminary drop pattern may be performed using any known technique or future developed technique, as the drop dispensing method described herein is independent of the particular manner in which the preliminary drop pattern is determined. That is, the drop dispensing method described herein can be performed using any preliminary drop pattern, regardless of how the drop pattern has been developed. Examples of generating a drop pattern that may be used as the preliminary drop pattern can be found in such documents as U.S. patent application Ser. No. 16/353,433, U.S. Pat. Nos. 8,119,052; 8,512,797; 8,586,126; 8,691,123; 9,415,418; and 9,718,096; and U.S. Pat. App. Pub. Nos.: 2010/0101493; and 2017/0140922. That is, the drop pattern determined from the methods described in these documents (or any other drop pattern) may serve as the step of providing a preliminary drop pattern.

Figure 4:
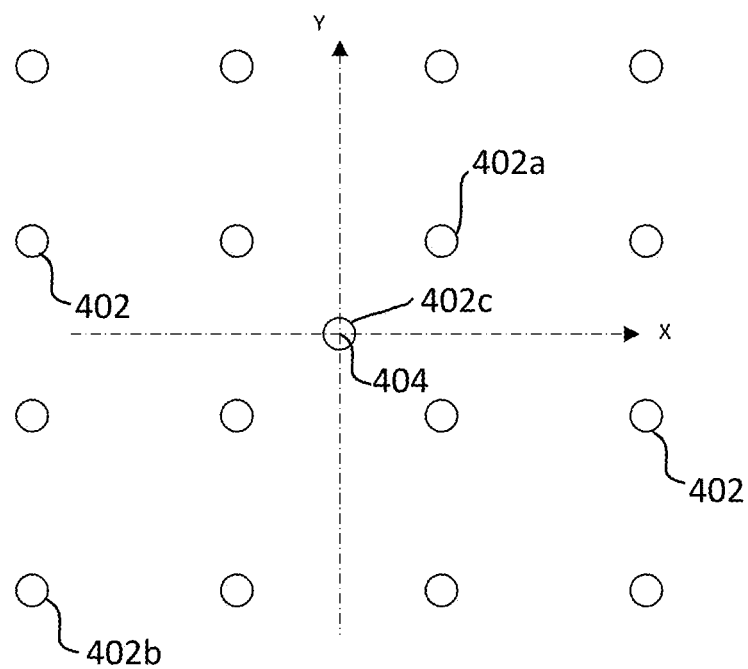
FIG. 4 is a schematic representation of an example preliminary drop pattern in accordance with an example embodiment.

FIG. 4 is a schematic representation of an example preliminary drop pattern 400. As shown in FIG. 4, the preliminary drop pattern 400 comprises a plurality of drops 402 disposed radially about a center 404. In this particular example the drops 402, 402a, 402b, 402c are located symmetrically around the center 404 with an equal number of drops in each quadrant. It should be understood that any number of drops can be located throughout the X-Y area depending on the particular application. The drops can be symmetrically disposed or asymmetrically supposed. There can be more drops in one quadrant than in another quadrant. While the drops 402 are schematically shown as circles in FIG. 4, it should be understood that in practice the drops are not necessarily circular and may have an amorphous shape. As discussed above, any known method may be used to arrive at a particular preliminary drop pattern 400. The preliminary drop pattern 400 essentially represents the desired location of the drops 402 on the substrate 102.

Once the preliminary drop pattern has been provided, the next step is to adjust the preliminary drop pattern to account for the above-noted forces that cause the center of mass of certain drops to be displaced during the imprinting/planarization process. The adjusted drop pattern can be created by radially shifting, relative to the center, each drop of a subset of drops of the plurality of drops from the predetermined location by a radial offset. The subset of drops are those drops whose center of mass is displaced during the imprinting/planarization drop. Not all of the drops will need to be radially shifted because not all of the drops are impacted by the displacing forces. Nevertheless, each drop of the adjusted drop pattern corresponds to a drop of the preliminary drop pattern. In other words, each of the drops of the adjusted drop pattern corresponds to a drop of the preliminary drop pattern, even if a drop has not been radially shifted in the adjusted drop pattern relative to the corresponding drop in the preliminary drop pattern. Accordingly, the adjusted drop pattern and the preliminary drop pattern have the same number of drops, the difference between the two patterns being that a subset of the drops are radially shifted in the adjusted drop pattern as compared to the corresponding drops of the preliminary drop pattern.

Figure 5:
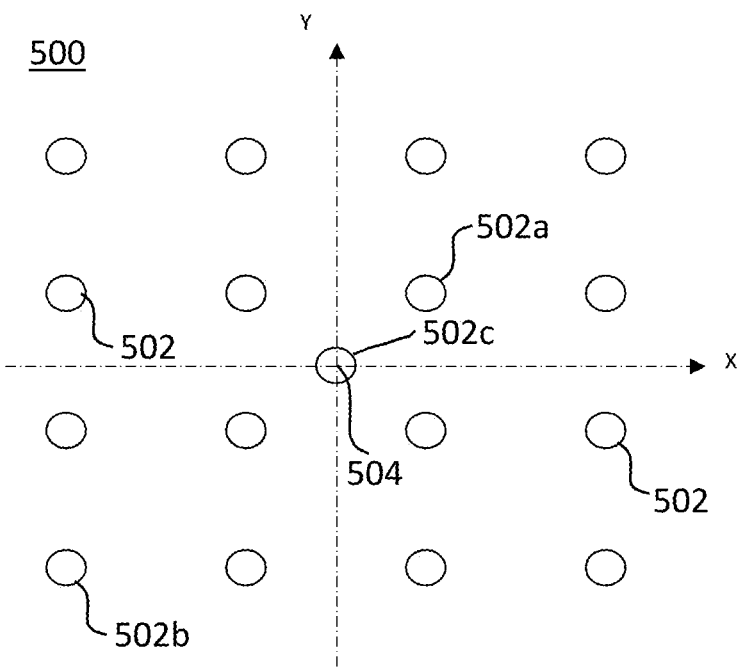
FIG. 5 is a schematic representation of an example adjusted drop pattern in accordance with an example embodiment.

FIG. 5 is a schematic representation of an example adjusted drop pattern 500. As shown in FIG. 5, the adjusted drop pattern 500 comprises a plurality of drops 502, 502a, 502b, 502c disposed radially about a center 504. Each of the drops 502 of the adjusted drop pattern 500 correspond to a drop 402 of the preliminary drop pattern 400. For example, drop 402a of the preliminary drop pattern 400 corresponds to drop 502a of the adjusted drop pattern 500, drop 402b of the preliminary drop pattern 400 corresponds to drop 502b of the adjusted drop pattern 500, and drop 402c of the preliminary drop pattern 400 corresponds to drop 502c of the adjusted pattern 500. The same principle can be applied to each of the drops. Notably, the number of drops in the adjusted drop pattern 500 is the same as the number of drops in the preliminary drop pattern 400, such that each drop of the adjusted drop pattern 500 corresponds with a drop of the preliminary drop pattern 400. In the example drop patterns shown in FIGS. 4 and 5, all of the drops of the adjusted drop pattern 500 have been radially shifted relative to the preliminary drop pattern 400, except for the drop 502c, whose center of mass is located at the exact center 404, 504. Thus, in this example, the subset of drops that have been radially shifted are all of the drops except for the center drop 402c, 502c.

Figure 6A:
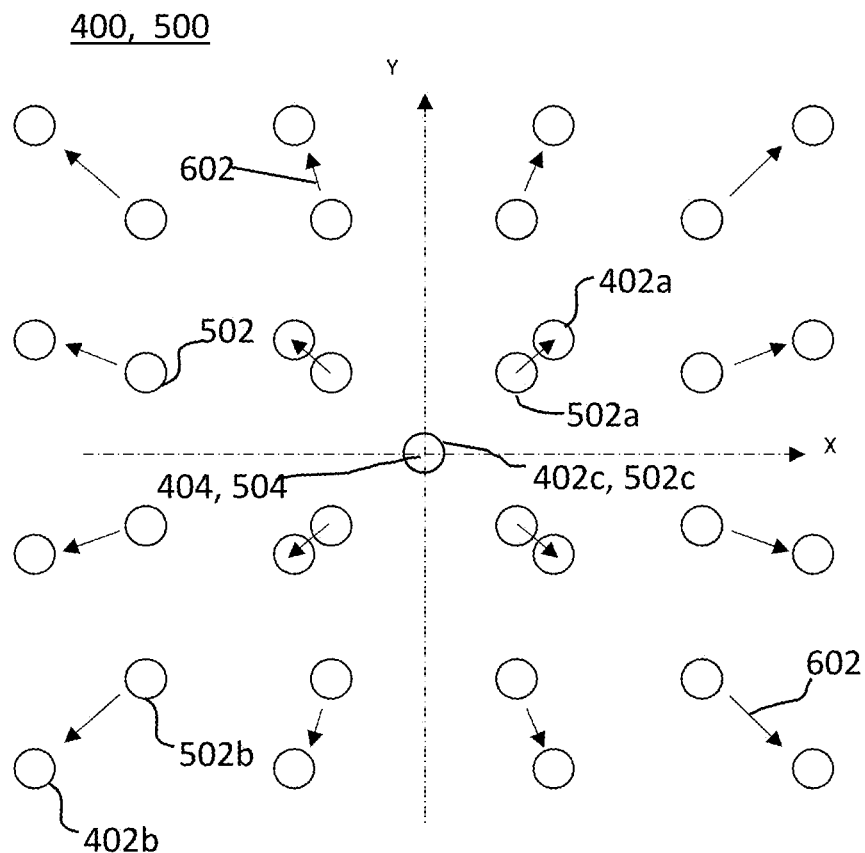
FIG. 6A is a schematic representation of the example preliminary drop pattern of FIG. 4 superimposed with the adjusted drop pattern of FIG. 5.

FIG. 6A is a schematic representation of the example preliminary drop pattern 400 of FIG. 4 superimposed with the adjusted drop pattern 500 of FIG. 5. By superimposing the two patterns, the radial shifting of the corresponding drops becomes apparent. Each drop of the adjusted drop pattern 500 is linked with the corresponding drop of the preliminary drop pattern 400 via an arrow 602. As schematically shown in FIG. 6A, the magnitude of radial shifting between the adjusted drop pattern 500 and the preliminary drop pattern 400 increases with drops that are farther from the center 404, 504. For example, drop 502a has a much lower magnitude of radial shifting relative to corresponding drop 402a as compared to the magnitude of radial shifting of drop 502b relative to corresponding drop 402a.

Figure 6B:
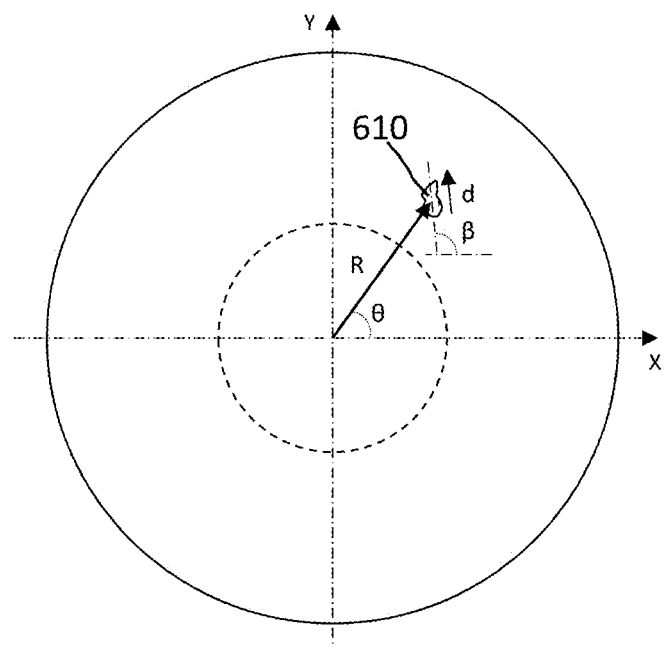
FIG. 6B is a schematic representation of the movement of an example drop with an angular component.

The shifting of the drop may further include an angular component. FIG. 6B shows a schematic representation of the movement of an example drop 602, with other drops omitted. As show in FIG. 6B, the drop 610 may start at an original position at a first location along radius R and at an angle θ. In addition to shifting in the radial direction during the imprinting/planarization process, the drop 610 may also shift angularly by to a second angle B. Thus, the shifting of the drops from the preliminary drop pattern to the adjusted drop pattern may also include an angular shifting relative to the original position, i.e., a rotational shifting.

The amount of radial shifting of the drops 502 of the adjusted drop pattern 500 relative to the desired position of the drops 402 of the preliminary drop pattern is selected based on a predicted amount of radial shifting that will occur when the template/superstrate is brought down and contacts the drops 502 of the adjusted drop pattern 500. FIGS. 7A to 7D schematically demonstrate the process of bringing down a template 108 to contact the drops 502, which is corresponds to steps S304 and S306 of the overall imprinting process 300 (or planarizing process). In this example, the template 108 is not shown having a pattern for simplicity. However, it should be understood that the template 108 may or may not have a pattern depending on the process being performed (i.e., imprinting or planarizing).

Figure 7A:
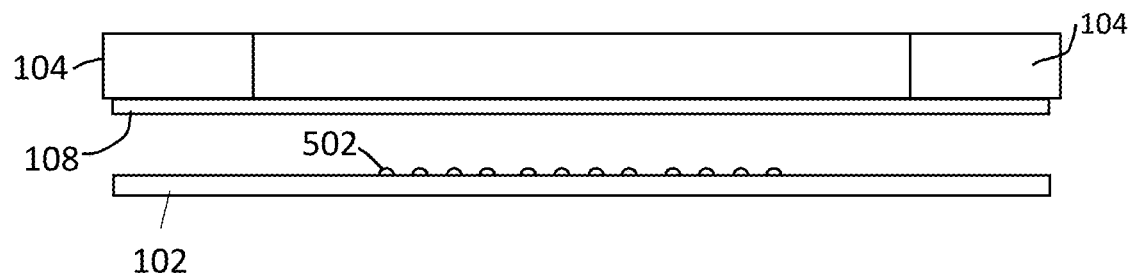
FIGS. 7A to 7D are a schematic representation of the process of bringing down a template/superstrate to contact dispensed drops in accordance with an example embodiment.

FIG. 7A shows the initial state prior to any movement of the template 108. In this initial state, the template 108 is flat/not bent and there is no imparted gas pressure behind the template 108, i.e., the pressure behind the template 108 is standard atmospheric pressure.

Figure 7B:
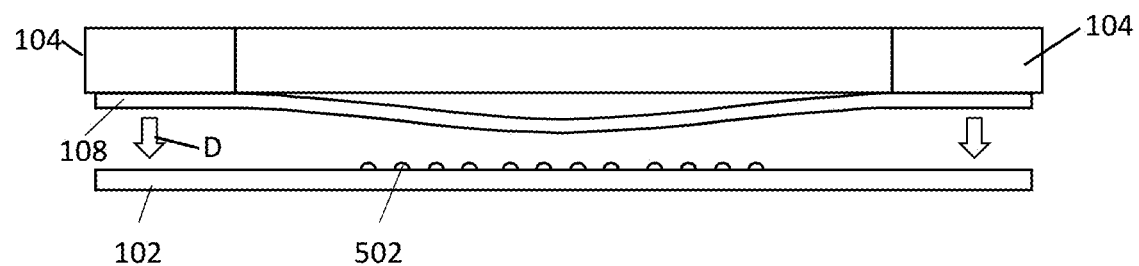

FIG. 7B shows a state just after the start of the imprint cycle. At this point in the process, the template chuck 104 starts moving down toward the substrate 102 in a direction represented by arrow D, bringing the attached template 108 as well. The pressure behind the template is set to a pressure higher than atmospheric pressure, for example in the range of 0.1 kPa to 100 kPa, which causes a certain degree of bending to the template 108, as shown in FIG. 7B.

Figure 7C:
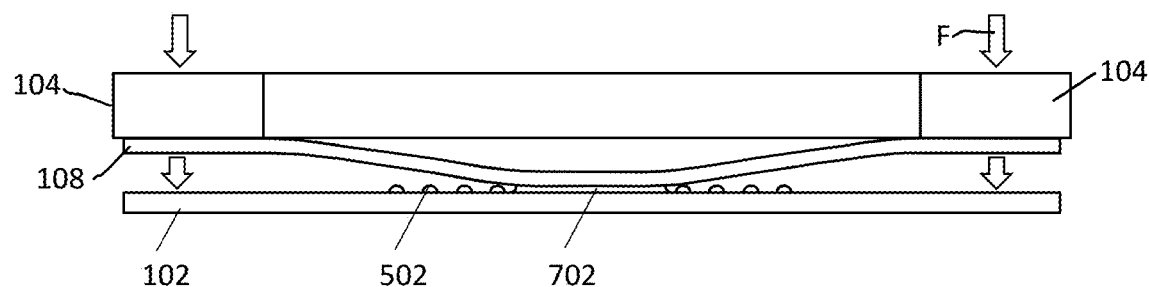

FIG. 7C shows a state where the bent template 108 begins to come into contact with the drops 502 against the substrate 102. As shown in FIG. 7C, in this state, the template 108 is contacting the substrate 102 with a predetermined force F, for example in the range of 0.1 N to 50 N, causing a portion of the drops 502 to merge and form a continuous film 702. As the template chuck 104 moves down, the pressure behind the template 108 is slowly reduced in conjunction with the force and the gap between template 108 and substrate 102 being reduced until reaching the state shown in FIG. 7D.

Figure 7D:
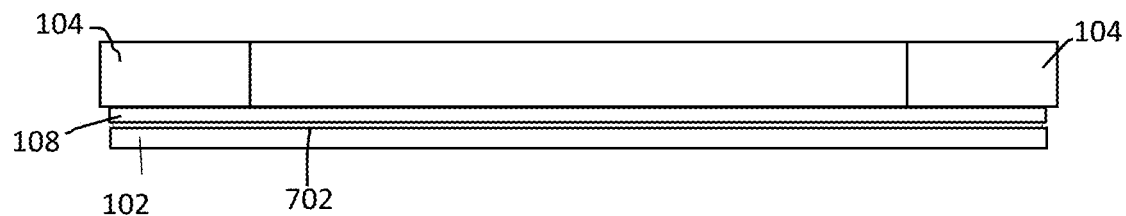

FIG. 7D shows a state at the end of imprint/planarizing cycle. At this state the template 108 is flat again and the formable material has completely merged into a continuous fluid 702 in the gap between the template 108 and the substrate 102. At this point, the additional pressure behind the template 108 and force applied to the template chuck 104 are approximately zero. That is, there is substantially no external force being applied to the template chuck 104 and the pressure is approximately atmospheric.

The above-described displacement of the center of mass of certain drops of the drops 502 of the adjusted drop pattern 500 occurs during the period between the state shown in FIGS. 7C and 7D. That is, the center of mass of certain drops is displaced as the bent template 108 contacts the drops 502 and gradually becomes flat, just before the drops are subsumed into the continuous fluid 702.

Figure 8:
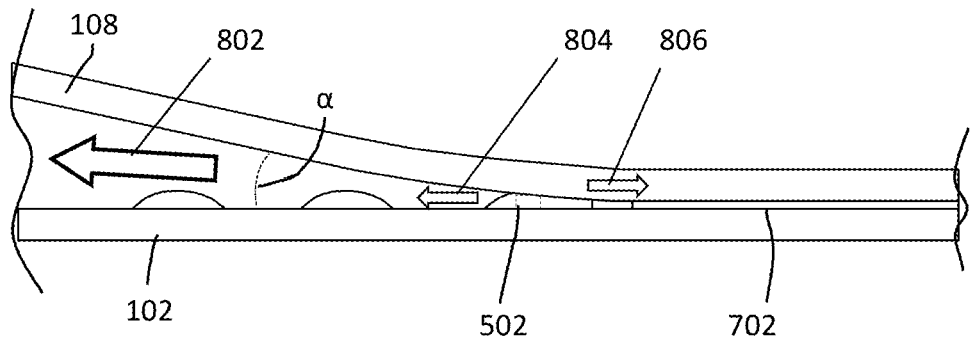
FIG. 8 is a schematic representation of a portion of the template/superstrate and a substrate at a moment when the template is being pressed against the dispensed drops in accordance with an example embodiment.

FIG. 8 schematically illustrates portion of the template 108 and substrate 102 at a moment in time during the imprinting/planarizing process when the template 108 is being pressed against the drops 502 and the substrate 102. As can be seen in FIG. 8, at the captured moment in time, a portion of the template 108 toward the center of the template and substrate has already been flattened, while a portion of the template 108 toward the perimeter of the template and substrate is still bent at an angle α. As shown in FIG. 8, the drops 502 closer to the template bending center merge to form the continuous fluid 702. Direction arrow 802 represents a direction in which gas escapes. Typically, the gas is nitrogen or helium. The gas may also be air, argon, neon, hydrogen, xenon and krypton, or any mixture of those. As the gas escapes in the direction 802, the gas may push a drop the direction indicated by direction arrow 804. As shown in FIG. 8, the direction 804 is outward toward the perimeter of the template 108 and substrate 102. At the same time, capillary forces may push the drop in the direction indicated by the direction arrow 806. As shown in FIG. 8, the direction 806 is inwardly toward the center of the template 108 and substrate 102. Due to these forces, the center of mass of a drop will be displaced relative to the originally dispensed center of mass, just prior to be subsumed into the continuous fluid 702. The displacement is primarily in a radial direction relative to the center point of the template 108, but may also have an angular displacement as noted above.

Returning to FIGS. 4 to 6B, a radial offset of certain drops of the preliminary drop pattern 400 to arrive at the adjusted drop pattern 500 may be selected to counterbalance the forces illustrated in FIG. 8. That is, the radial offset may be selected on a drop-by-drop basis such that when the adjusted drop pattern 500 is dispensed, and the template 108 is pressed against the drops 502, the center of mass of the drops 502 are displaced to end up at approximately the same location as the center of mass of the corresponding drop of the preliminary drop pattern, within an acceptable amount of deviation. In other words, the deviation is the distance between the adjusted location and the target location of the preliminary drop pattern. For example, the acceptable deviation may be 50 μm or less, 45 μm or less, 40 μm or less, 35 μm or less, 30 μm or less, 25 μm or less, 20 μm or less, 15 μm or less, 10 μm or less, 5 μm or less, or 1 μm or less. Drop 402a, drop 402b, and drop 402c of the preliminary drop pattern 400 and corresponding drop 502a, drop 502b, and drop 502c illustrate how the radial offset is chosen on a drop-by-drop basis. In the case of drop 402a, the drop is adjusted by a radial offset shown in FIG. 6 from the original location in the preliminary drop pattern 400 to a new location of corresponding adjusted drop 502a in the adjusted drop pattern 500. Similarly, in the case of drop 402b, the drop is adjusted by a radial offset shown in FIG. 6A from the original location in the preliminary drop pattern 400 to a new location of corresponding adjusted drop 502b. In the case of drop 402c, the drop is not adjusted and the corresponding drop 502c is the same location. A customized radial offset was chosen for drop 402a/502a and 402b/402b such that after the template 108 is pressed down upon the drop 502a and the drop 502a, the center of mass of each drop will be displaced to the originally desired location (within an acceptable deviation) of the center of mass of the preliminary drop 402a and drop 402b. No radial offset is necessary for drop 402c because the center of mass of the drop 502c is not displaced when the template 108 is pressed down upon the drop 502c. In summary, as the template is pressed upon the adjusted drop pattern 500, just before the drops are subsumed into a continuous liquid, the center of mass of each drop of the drop pattern 500 arrives at the location of the center of mass of the corresponding drop of the preliminary drop pattern 400, within the acceptable amount of deviation, because the radial shifting accounts for the forces shown in FIG. 8.

The particular amount of radial shifting applied to each drop to create the adjust drop pattern can be determined in the following manner. The angle of the template a (FIG. 8) relative to the substrate varies as a function of the radius from the center point of the template/superstrate. For example, as schematically shown in FIG. 7C, there is no bending at the exact center of the template/superstrate and no bending at the absolute edge of the template/superstrate, at this moment in time. That is, the template angle α at the center of the template/superstrate is 0 and the template angle α at the edge of the template/superstrate is also 0, a the moment shown in FIG. 7C. However, the template angle α increases as at radial points farther from center until reaching a maximum point, after which the template angle α decreases until reaching the above-note edge where the template angle α returns to 0. When the template angle α is larger the forces described above with respect to FIG. 8 are greater. Accordingly, the amount of displacement of the center of mass of a particular drop will also depend on how close the drop is to the center of the template/superstrate.

Example embodiments regarding how the amount of radial shifting on a drop-by-drop basis can be determined are as follows.

Figure 9:
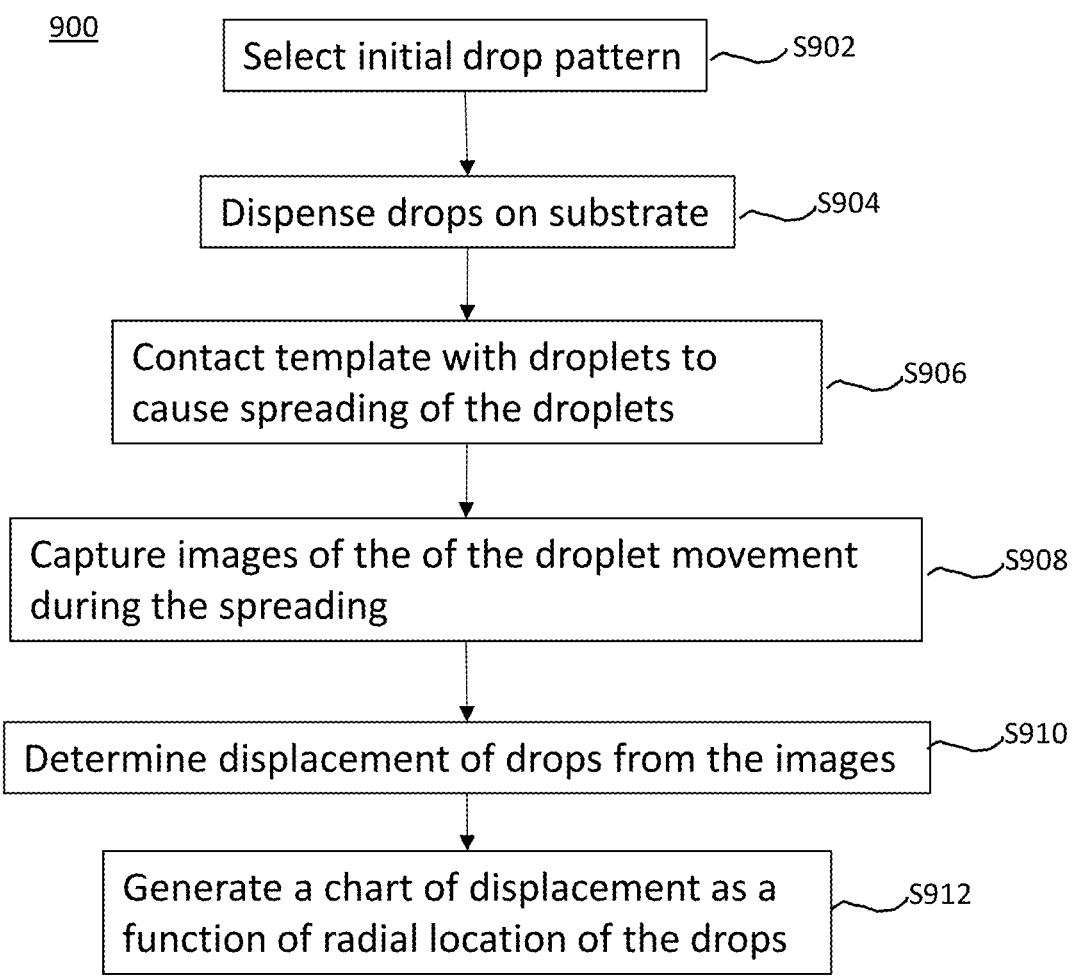
FIG. 9 is a flowchart illustrating a first empirical method to generate a displacement chart as a function of radial location in accordance with an example embodiment.

In a first example embodiment, the amount of radial shifting for each drop can be determined using a first empirical method 900, shown in FIG. 9. The first step S902 of the first empirical method 900 is to select an initial drop pattern. The selected drop pattern may be any initial drop pattern that does not yet have any correction to the radial position of the drops. That is, similar to the above-discussed preliminary drop pattern, the selected initial drop pattern may be determined from any known methods such as those described in the above-cited documents. Once the initial drop pattern has been selected, the method proceeds to step S904 where the drops of the drop pattern are dispensed onto the substrate. These steps are essentially the same as step S302 described above. Next, the method proceeds to step S906, where the template/superstrate is brought into contact with the drops to spread the drops on the substrate. This step is essentially the same as step S304 described above. However, during the same time that step S906 is performed the method simultaneously includes step S908 where images of the drop movement is captured. The images may be captured using a series of photos or a video. For example, the images may be captured using the field camera 136 and/or the drop inspection system 138. In other words, as the template progresses from the position shown in FIG. 7B to 7D, images may be captured of the position of the drops just before the drops are combined to form the continuous film.

Figure 10:
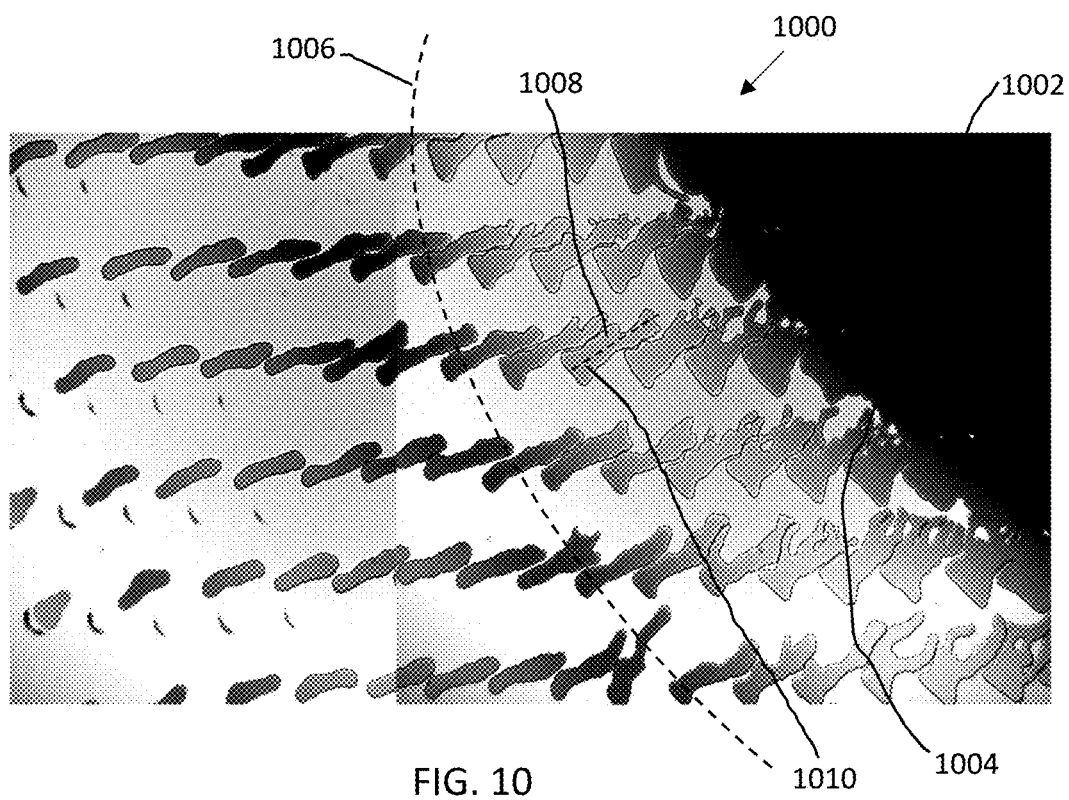
FIG. 10 is an illustration of an example image of a portion of the drops when the template/superstrate has begun to contact some drops in accordance with an example embodiment.

FIG. 10 shows a an example image 1000 of a portion of the drops during a particular moment in time when the template/superstrate has begun to contact some drops, but not yet contacted other drops. That is, the example image 1000 is taken after the position shown in FIG. 7B but before the position shown FIG. 7D. As seen in FIG. 10, the image includes a portion of the continuous resist 1002 where some drops have already combined. The boundary 1004 of the continuous fluid is also known as the fluid front. The fluid front continuously changes as the template/superstrate continues to press down and drops continue to be subsumed into the continuous film. An example of this is also shown in FIG. 8 as discussed above. At a moment in time just before the fluid front 1004 subsumes other drops, the final displacement of a drop occurs. For example, any drops within 100 μm of the fluid front can be considered to have reached their maximum displacement. However, other distances can be used depending on the field of view of the camera, the speed of the fluid front, and other parameters of the particular imprinting/planarizing process being performed. For example, any drops within 25 μm, 50 μm, 75 μm, 100 μm, 125 μm, 150 μm, 175 μm, or 200 μm may be considered to have reached their maximum displacement.

Line 1006 schematically represents a point where the drops on the side closer to the fluid front 1004 are considered to have reached their maximum displacement, while the drops on the other side of the line are considered to not have yet reached their maximum displacement. Thus, line 1006 may be located at a distance of 25 µm, 50 µm, 75 µm, 100 µm, 125 µm, 150 µm, 175 µm, or 200 µm from the fluid front 1004. As the template/superstrate continues to flatten as discussed above with respect to FIGS. 7B to 7D, the images are continuously taken as the fluid front 1004 continues to move toward the outer perimeter of the substrate. That is, a similar image to that shown in FIG. 10 is repeatedly acquired to capture the point of maximum displacement of many of the drops. The number of images and number of drops captured at their maximum point of displacement may vary. In general, the greater number of drops that are captured, the more accurate the final model will be a predicting the displacement of the drops for similar patterns. However, an sufficiently accurate model can be established with significantly less than all of the drops being captured in most instances. For example, is some embodiments enough images may be taken such that 10% to 90% of the drops are captured at their maximum point of displacement. In other embodiments, a sufficiently accurate model can be established when enough images are taken such that 15% to 80%, 20% to 70%, 25% to 60%, or 30% to 50% of the drops are captured at their maximum point of displacement. As noted above, instead of still images being taken, a video may be taken from the moment the template/superstrate begins to contact the drops until the moment the template/superstrate is completely flat. In this case, still images may be extracted from the video as often as necessary to capture enough drops at their maximum point of displacement. In one example embodiment, the still images (or the extracted still images from the video) may be acquired every 25 µm, 50 µm, 75 µm, 100 µm, 125 µm, 150 µm, 175 µm, or 200 µm of the fluid front propagation. That is, every time the fluid front moves by the selected distance, another image may be acquired.

Figure 11:
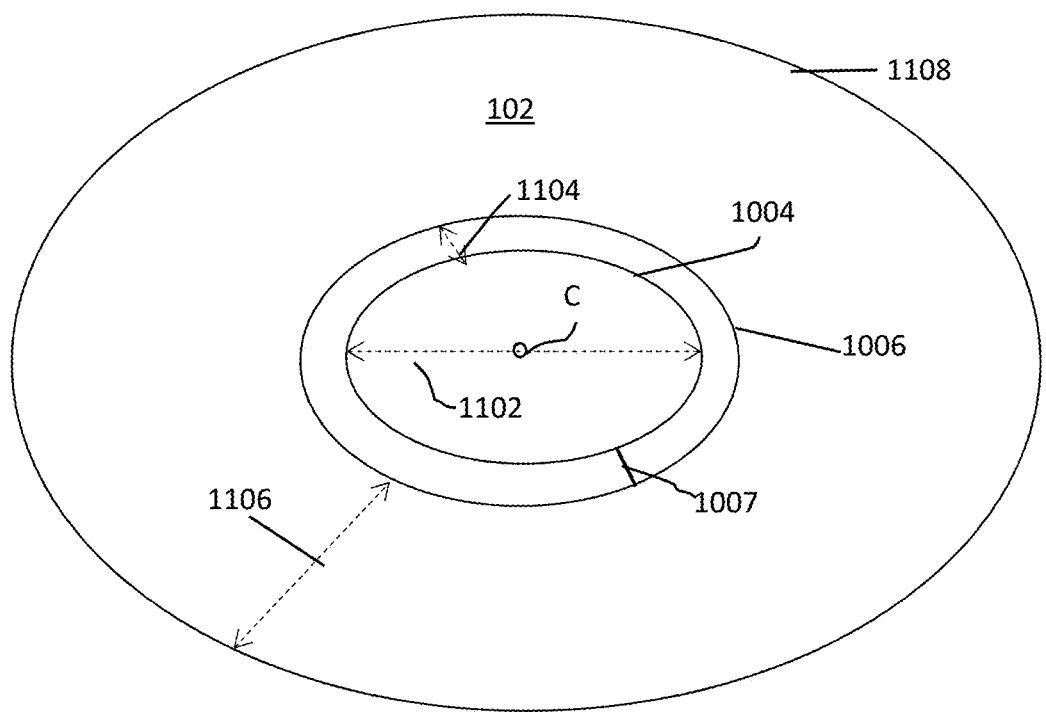
FIG. 11 is a schematic representation of a fluid front in accordance with an example embodiment.

FIG. 11 is a schematic view of the entirety of the fluid front 1004 at a moment in time. That is, while FIG. 10 shows an image of a relatively small portion of the fluid front 1004, FIG. 11 schematically shows what the fluid front would look like when looking at a scale large enough to view the entire substrate 102, where C represents the center of the substrate 102. FIG. 11 shows the fluid front 1004 and the line 1006, where the line 1006 is at a distance 1007 from the fluid front 1004 by a certain amount. In other words, distance 1007 represents the distance from the fluid front 1004 in which the drops are considered to be at their maximum displacement, the range of which is provided above. Thus, in FIG. 11, three areas are shown. A first area 1102 extends from the center C to the fluid front 1004. In the first area 1102 the drops have already formed a continuous fluid. A second area 1104 extends from the fluid front 1004 to the line 1006. In the second area 1104 the drops have not yet been subsumed into the continuous fluid, but are considered to be at their maximum displacement. A third area 1106 extends from the line 1006 to the edge 1108 of the substrate 102. In the third area the drops have not been subsumed into the continuous fluid, and are considered to not yet have reached their maximum displacement. As the imprinting/planarizing process proceeds, the fluid front 1004 will continue to spread radially toward the edge 1108 as will the line 1006, with the distance 1007 remaining constant. Thus, as the process proceeds, the first area 1102 will continue to get larger while the third area 1106 will continue to get smaller. As described above, during the process, as the template/superstrate continues to flatten and the front 1004 and line 1006 at a distance 1007 from the front 1004 continues to move toward the edge 1108, the images and/or video is taken through the second area 1104.

After the images have been taken, the method proceeds to step S910 where the displacement of the drops are measured. In particular, at the point of maximum displacement for each captured drop, the displacement is determined from the image. The displacement of the drop can be determined for example by directly measuring the length of the drop from end to end in the direction of elongation. For example, as shown in FIG. 10 a drop 1008 within area between the line 1006 and the front 1004 has a length 1010. This length can be considered as the displacement of the drop and can be measured from the image. In another aspect, to provide a more precise value, the original length of the drop may be subtracted from the measured length, where the difference in length is consider may be used as the displacement value. In such a case, the length of each drop may be recorded prior to contacting the template/superstrate with the drops. Another manner of measuring the displacement is to determine the center of mass of the drop at the point of maximum displacement. The center of mass may be calculated based on the shape of the drop shown in the image and based on the composition of the drop using known calculation methods. The distance between the center of mass of the drop at the point of maximum displacement and the center of mass of the drop prior to displacement may be used as the displacement value.

After the displacement of the drops is determined, the method proceeds to step S912, where a chart is generated that provides the displacement of the drops as a function of the radial location of the drops. The chart can be generated by first plotting all of the data points collected in steps S910. In particular, after step S910, the radial location and the amount of the displacement on a drop by drop basis is known. Each data point may be plotted, for example, where the x-axis is the radius and the y-axis is the displacement. A best-fit line may then be calculated from the data using standard mathematical methods known in the art. The number of data points necessary to create an accurate best-fit line can be determined through routine experimentation.

Figure 12:
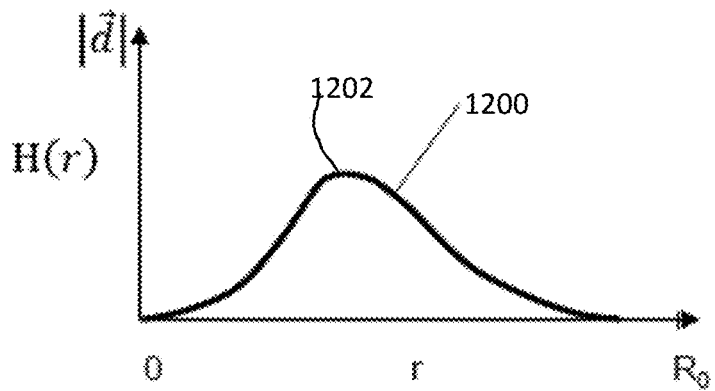
FIG. 12 is an illustration of an example chart of displacement as a function of radial location in accordance with an example embodiment.

FIG. 12 illustrates an example displacement chart with function H(r) having a curve 1200 generated from the above-described process. The x-axis of the chart represents the radius r, where the radius r is the radial distance of a drop relative to the center of the template/superstrate. As seen in FIG. 12, the radius ranges from a minimum value of 0 and a high value of $R_0$, where "0" represents the center of the template/superstrate and $R_0$ represents a location of the template/superstrate at the farthest edge (i.e., edge 1108) of the template/superstrate. The y-axis of the chart represents the amount of displacement d of the drops. The curve 1200 is an example of how the radius r correlates with the displacement d during the imprinting process. As seen in FIG. 12, at first, as the radius r increases, the displacement d also increases. Eventually a peak point 1202 is reached, where the displacement d has reached a maximum value, after which point the displacement d decreases as the radius r continues to increase. In other words, at locations farther away from the center point of the template/superstrate, at first the displacement d increases, but then after a peak point, the displacement d begins to decrease as the location of the drop continues to get farther from the center. Thus, by using the above-described first empirical method one can then arrive at a chart of displacement as a function of radial location of the drops.

Figure 13A:
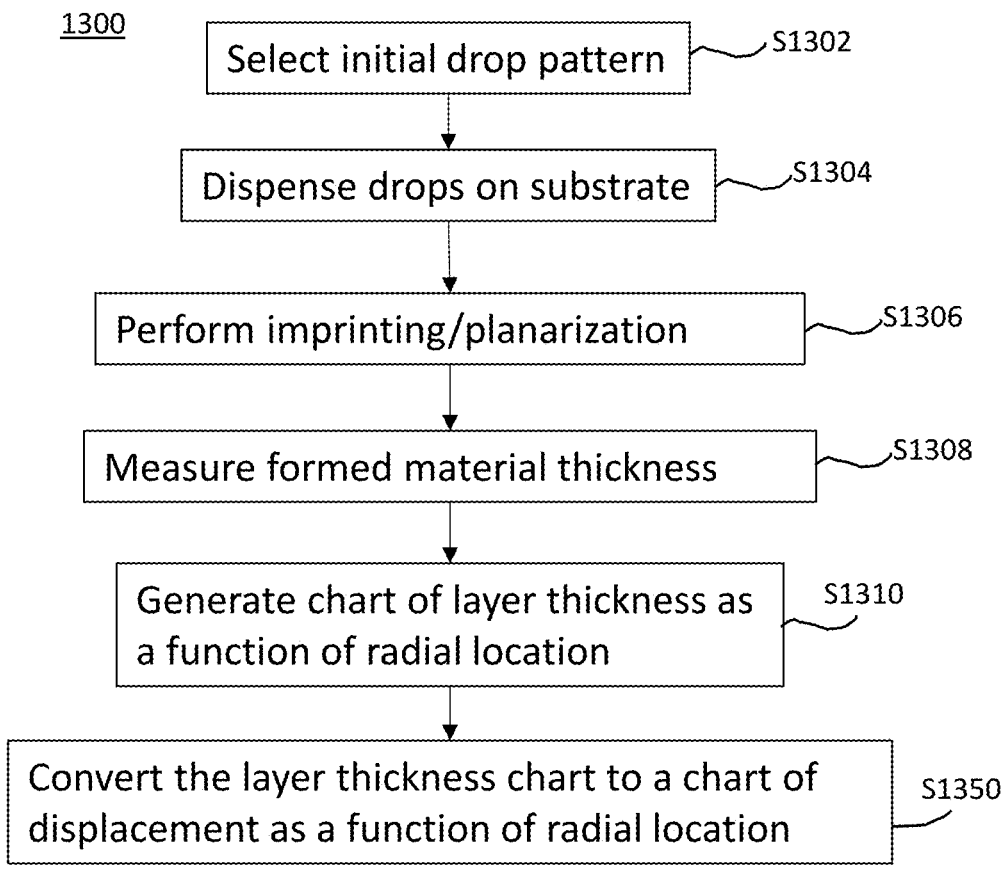
FIGS. 13A and 13B are flowcharts illustrating a second empirical method to generate a displacement chart as a function of radial location in accordance with an example embodiment.
Figure 13B:
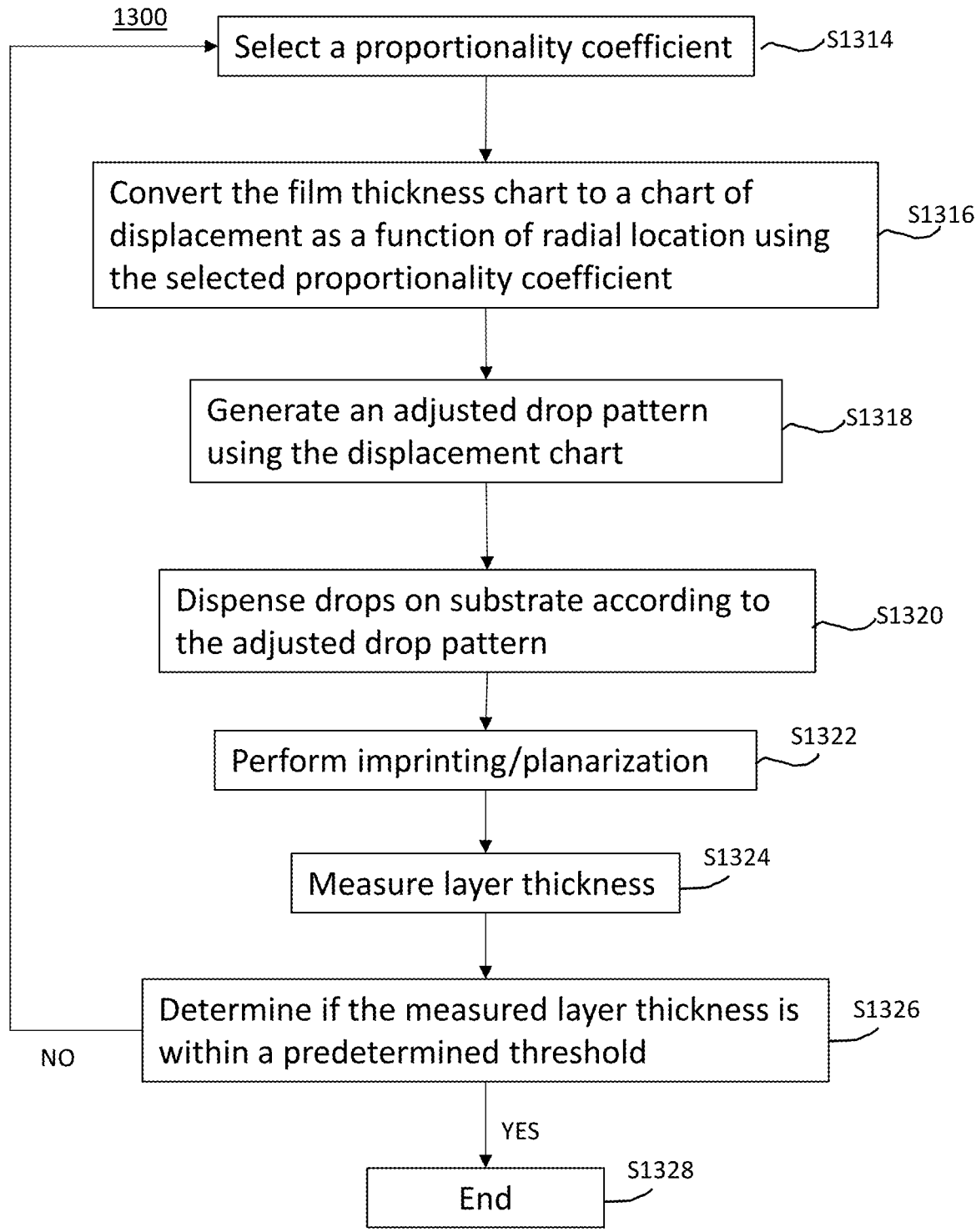
Figure 14:
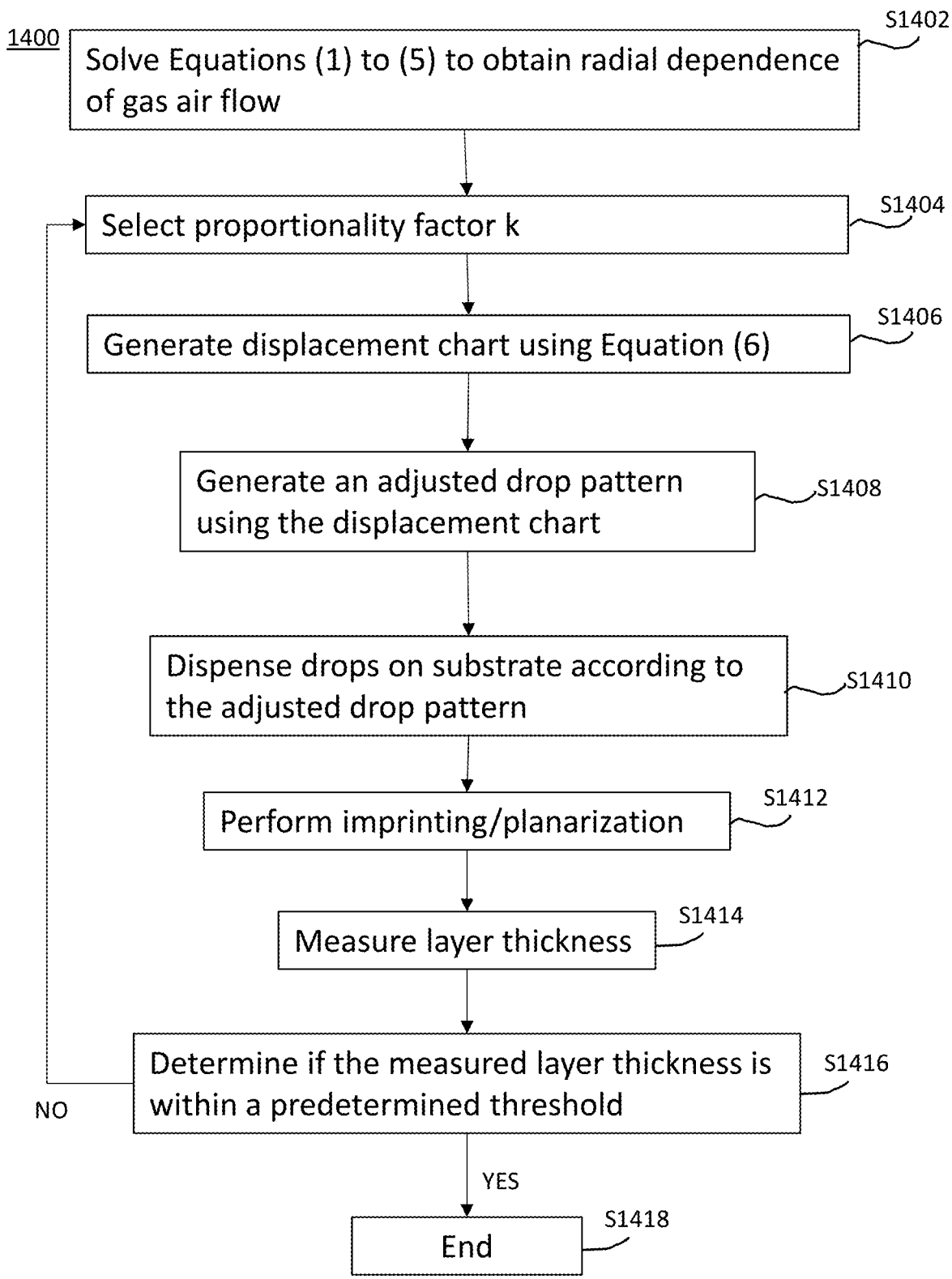
FIG. 14 is a flowchart illustrating an analytical method to generate a displacement chart as a function of radial location in accordance with an example embodiment.

In a second example embodiment, the amount of radial shifting for each drop can be determined using a second empirical method 1300, shown in FIGS. 13A and 13B. The first step of the second empirical method 1300 is to select a drop pattern S1302. The selected drop pattern may be any initial drop pattern that does not yet have any correction to the radial position of the drops. That is, similar to the above-discussed preliminary drop pattern, the selected drop pattern may be determined from any known methods such as those described in the above-cited documents. Once the drop pattern has been selected, the method proceeds to step S1304 where the drops of the drop pattern are dispensed onto the substrate. This step is essentially the same as step S302 described above. Next, the method proceeds to step S1306, where the imprinting/planarizing is performed to created a layer of formed material. This step is essentially the same as steps S304 to S310 described above.

After the layer of formed material is created, the method proceeds to step S1308 where the thickness of the formed thickness is measured at various radial points relative to the center of the substrate. The thickness may be measured using any suitable method in the art. One such method is using an optical ellipsometer, in particular in the context when both the superstrate and the substrate are blank such as in a planarizing process. An optical ellipsometer is device known in the art that measured dielectric properties of thin films. Ellipsometry measures the change of polarization upon reflection or transmission and compares it to a model to characterize thickness. Because the change of polarization depends on the thickness as well as the material properties, ellipsometry can be a universal tool for contact free determination of thickness and optical constants of films of all kinds. The optical ellipsometer can thus be used in the manner known in the art to measure the thickness of the formed material at various radial points. The spot size of a typical ellipsometer may be less 0.5 mm, less than 0.1 mm, or less than 0.05 mm. The scan step of the ellipsometer ideally matches an average distance between the drops. Thus, the ellipsometer scan step can be preselected based on the particular drop pattern. If average distance between drops is smaller than the smallest spot size available, then the step size can be increased to the size of the beam cross-section, for example 0.5 mm.

Other methods of measuring the thickness of the formed material can be used when one or both of the template and substrate have a pattern. For example, one such method is atomic force microscopy (AFM) scratch method. In this method, a narrow scratch is made in the formed material with a soft tip to remove the formed material layer of the template or substrate. Then, known AFM techniques are used to measure the thickness of the layer by examining the scratch. As above, the measurement can be taken at a plurality of radial points. The distance between the measurement points is ideally on the same scale as the average distance between the resist drops. Those having ordinary skill in the art can optimize the ideal measuring parameters and the particular process of measuring the thickness using AFM.

After measuring the material thickness at step S1308, the method may proceed to step S1310 where a chart of the film thickness as a function of radial location is generated. This step may first include calculating a difference between the measured thickness and a target thickness at the particular radial location. That is, in a particular imprint/planarizing process, the desired thickness of the layer at a particular radial point is known. The initial drop pattern and other operating parameters would have been chosen with the goal of having a certain layer thickness that would be predetermined. After obtaining the various measurements, the measured thickness at a given radial location can be subtracted from the predetermined goal thickness at that same radial location. Thus, for each measurement taken, a difference in thickness can be acquired. The difference in thickness data may be plotted on a chart similar to the displacement function shown in FIG. 12. The x-axis would similarly be the radial point of the measurement, i.e., a relative radial position away from the center point where the thickness measurement was taken. The y-axis, instead of displacement value, would be the calculated difference in thickness. As above, a best-fit curve may be generated using the data points to create a predictive model of the difference in thickness at a particular radial point. Also as above, the number of data points needed to create a sufficiently accurate representative model (i.e., a model in which non-measured data points along the generated best-fit curve are sufficiently accurate relative to measured data points) may be determined through optimization.

After generating the chart of film thickness as a function of radial location in step S1310, the method may then proceed to step S1350 where the chart acquired in step S1350 is converted into a chart of displacement as a function of radial location 1200. Because the difference in thickness between the actual and the goal is proportional to the displacement of the drop, the displacement function can be acquired from the thickness function by multiplying by a proportionality coefficient. For example in one example, a measured layer thickness may be 28 nm at a particular first radial location, while a measured layer thickness a second radial location is 24 nm, where the target thickness at each location is 20 nm. The difference between the first measured point and the target is 8 nm, while the deference between the second measured point and the target is 4 nm. In this example, the relative amount of drop displacement should be proportional to the magnitude of the thickness difference, i.e., the amount of displacement of the drop in the first location should be twice more than the amount of displacement of the drop in the second location. Determining the appropriate proportionality coefficient to acquire a sufficiently predictive displacement function may be achieved through an iterative process. The iterative process is part of the overall method 1300 and is shown in FIG. 13B. That is, the iterative process occurs within the overall process 1300 in order to acquire a final displacement chart in step S1350.

Turning to FIG. 13B, the first step in the iterative process is step S1314 where a proportionality coefficient is selected. This proportionality coefficient may be an estimate of a starting point for what the final proportionality coefficient will be after the iterations. For example, the first selected proportionality coefficient may be based on the scale of difference between the measured layer thickness and the target thickness. For example, for every 1 nm of difference, the drop displacement adjustment can be chosen as 10 microns. Thus, in one example embodiment the first proportionality coefficient may be $10^4$. However, other values can be selected such as from $10^3$ to $10^5$.

After the first proportionality coefficient is selected in step S1314, the method proceeds to step S1316 where the film thickness chart is converted into a displacement chart using the first proportionality coefficient. In particular, because the film thickness chart is a chart of differences in film thickness, multiplying the curve by the first proportionality coefficient (e.g., $10^4$), converts the curve from a difference in thickness to an amount of displacement. Thus, the resulting curve is a first chart of the displacement of each drop as a function of radial position of each drop.

Once the first displacement chart is generated in step S1316, the method may proceed to step S1318 where an adjusted drop pattern is generated from the initial drop pattern used in steps S1302 to S1308. That is, a first adjusted drop pattern is generated by displacing each drop of the initial drop pattern according to the curve in the first displacement chart. In other words for each drop of the initial drop pattern, where each drop has a radial location, the curve of the first displacement chart is used to determine the amount of radial displacement that should be applied to that particular drop. Once the displacement has been applied to every drop, the resulting drop pattern with the new radial location of each drop is the first adjusted drop pattern.

Once the first adjusted drop patter is acquired in step S1318, the method proceeds perform the normal imprinting/planarization process as set forth above. That is, the method proceeds to step S1320 where the drops of the first adjusted drop pattern are dispensed on a substrate, then step S1322 where the imprinting/planarization is performed. These steps are essentially the same steps as S302 to S310 or S1306 and S1308 discussed above. After the imprinting/planarization step S1322 has been completed, the method may proceed to again measuring the film thickness of the resulting layer in the same manner as discussed above. That is, at step S1324 a second layer has been imprinted/planarized on a substrate, where the difference between the first imprinting/planarization there was no adjustment to drop pattern and the second imprinting/planarization there was an adjustment to the drop pattern using the first displacement chart.

After acquiring the measured thicknesses in step S1324, the process proceeds to step S1326 where it is determined whether the measured layer thickness is within an acceptable predetermined threshold value from the target thickness. For example, an acceptable difference may be from 2 nm to 10 nm. The acceptable difference may depend on the particular product being manufactured. The step 1326 may also include determining whether a number of measurements exceeding the acceptable difference exceeds an acceptable threshold value. That is, in some instances, even if there are some measurements in which the thickness exceeds the acceptable difference, as long as the amount of these instances are below a threshold amount, the resulting layer may still be considered acceptable. For example, in some embodiments it would be acceptable for 15% or less, 10% or less, 5% or less, 1% or less, 0.5% or less, 0.1% or less, 0.01% or less, or 0.001% or less of the measured thicknesses to be outside the predetermined threshold value. Likewise, in some embodiments it would be acceptable if 85% or more, 90% or more, 95% or more, 99% or more, 99.5% or more, 99.9% or more, 99.99% or more, or 99.999% or more of the measured thicknesses are within the predetermined threshold value. A higher percentage of measurements being within the predetermined threshold value is applicable to planarization applications, while a lower percentage of measurements being within the predetermined threshold value is applicable to some imprint applications.

If the determination in step S1326 is YES, i.e., that the measured layer thickness are within an acceptable amount of error in the thicknesses, then the method proceeds the end at step S1328. In this case, the chosen proportionality coefficient was accurate enough to result in a sufficiently adjusted drop pattern. Thus, in this case, the drop displacement chart is the final chart shown in FIG. 12 and no further steps need to be taken. That is, the method returns to step S1350 with the final displacement function.

If the determination in step S1325 is NO, then the method return to Step S1314 where a different proportionality coefficient is selected. That is, in the case where there is an unacceptable amount of error in the thicknesses, the first proportionality coefficient, and therefore, the first displacement curve, is not acceptable and the process needs to be repeated from steps S1314. In this case, a second proportionality coefficient is selected that is either higher or lower than the previous proportionality coefficient. The process continues through steps S1314 to S1326 repeatedly until the determination is S1326 is YES. In other words, a new proportionality coefficient is chosen (second, third, fourth, etc.), a new displacement chart is produced (second, third, fourth, etc.), a new adjusted drop pattern is generated (second, third, fourth, etc.), and a new imprinting/planarization is performed (second, third, fourth, etc.). This is repeated two, three, four, etc. times until the measured layer thickness is within a predetermined threshold. At this point, once the answer to step 1326 is YES, after however many iterations as necessary are performed, the final displacement chart that resulted in YES is the displacement chart to be ultimately used. Thus, once reaching the end at step S1328, after as many iterations as necessary, the resulting displacement chart is acquired thereby completing step S1350.

In a third example embodiment, the amount of radial shifting for each drop can be determined using an analytical method 1400. The analytical method 1400 is a method in which the displacement chart (prior to the iterations discussed below) can be generated through mathematical modeling without the need to directly measure either movement of the drops as in the in first empirical method or thickness of the material layer as in the second empirical method.

The analytical method 1400, begins at step S1402 where Equations (1) to (5) are solved. Equations (1) to (5) are as follows:

$$I = \frac{t^3}{12} \quad (1)$$

$$z(r) = -\frac{P}{72EI}(3r^4 - 4(a-b)r^3 + (a-b)^4), \text{ where } b \le r \le a \quad (2)$$

$$z'(r) = \propto (r) = -\frac{P}{6EI}r^2(r - (a-b)) \quad (3)$$

$$z''(r) = \frac{1}{\rho(r)} = -\frac{P}{6EI}r(3r - 2(a-b)) \quad (4)$$

$$V = -\frac{h^2}{3\xi}\frac{dP}{\Delta} \quad (5)$$

Equation (1) represents the moment of inertia of the template/superstrate, where "I" represents the moment of inertia, and parameter "t" represents the thickness of the template/superstrate. The thickness, t, is a known value. Thus, the moment of inertia, I, can be calculated. Equation (2) represents a bending function of the template. Parameter "P" represents the pressure applied to the back side of the template/superstrate and is a known value as part of the imprinting/planarizing process. E represents the Young's modulus of the template/superstrate and is known based on the material of the template/superstrate, e.g., a glass material may have a Young's modulus of 72 GPa. Parameter "b" represents a radius where the template is flat from the center of the template/superstrate to a point just before the template/superstrate begins to bend. Parameter "a" represents a radius where the template/superstrate returns to being flat. Parameter "r" represents a radius between b and a where the template/superstrate is bent. Parameter b and r increases over time as the template/superstrate continues to flatten during imprinting/planarizing process. Thus, b and r are variable. Equation (3) is a the first derivative of the Equation (2), where α(r) is the slope of the template/superstrate surface as a function of r. Equation (4) is the second derivative of the Equation (2), where ρ(r) is bending radius of the template/superstrate as a function of r.

Figure 15:
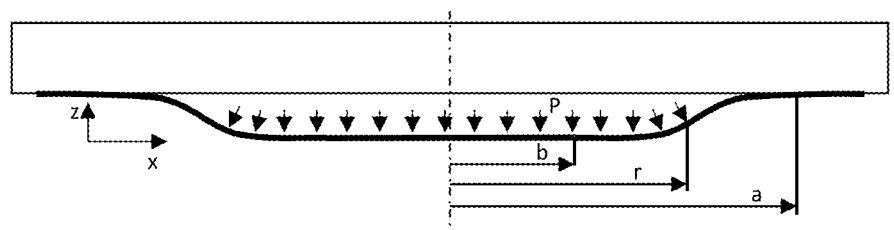
FIGS. 15 and 16 are illustrations of a simplified geometric model of the template/superstrate bending in accordance with an example embodiment.
Figure 16:
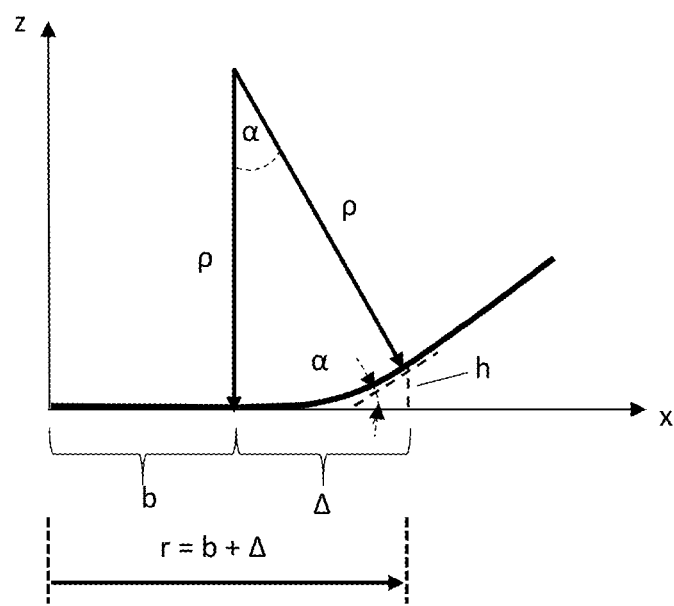

FIGS. 15 and 16 show a simplified geometric model of the template/superstrate bending. In FIG. 16, the bending radius is denoted by ρ. As seen in FIGS. 15 and 16, the radius b, i.e., the flat portion turns into the bent radius r at a point Δ away from the radius b. That is, the bent portion r at a particular moment can be considered to exist at a radius b+Δ. The value of Δ can selected as the distance from b where the maximum displacement of the drops occurs. For example, as discussed above, at a distance too far from the liquid front, the forces on the drops not yet subsumed into the continuous fluid will not yet have experienced displacement. Thus, the selection of A is essentially the same as the distanced 1007 discussed above. That is, A may set to be 25 μm, 50 μm, 75 μm, 100 μm, 125 μm, 150 μm, 175 μm, or 200 μm. The selected value of Δ is thus a known constant. As seen in FIG. 15, the gap between the substrate and the template/superstrate at the angle α is represented by h. The gap h can be geometrically calculated as function of radius, with the angle α also being a function of radius.

Figure 17:
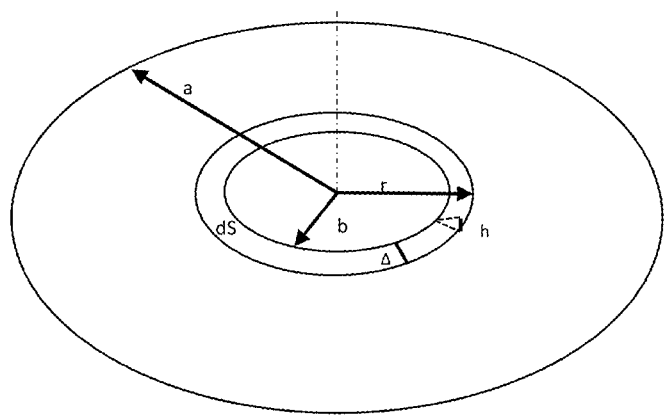
FIG. 17 is an illustration of a schematic view showing an area encompassed by the bent area of FIGS. 15 and 16 in accordance with an example embodiment.

FIG. 17 is a schematic view showing the area encompassed by the bent area, represented by dS. FIG. 17 is similar to FIG. 11 in that the fluid front essentially begins at radius b and the displacement of the drops occurs in the entire area dS (i.e., the area encompassed between b and b+Δ). The area dS is calculable as a function of radius using geometry, i.e., $dS(r)=\pi(r^2-(r-\Delta)^2)=\pi(2\Delta r-\Delta^2)$. However, the area dS only represents the two-dimensional area extending over the substrate. Taking into the account the gap h to arrive at a three-dimensional volume within the bending area, the volume can be calculated as a function of radius using geometry, i.e., $dV(r) \sim \pi(2\Delta r-\Delta^2)h/2$.

Turning to Equation (5), the equation is the Navier-Stokes equation for gas flow between two parallel plates. In Equation (5), V represents the velocity of the gas, h is the distance between the plates (i.e., the gap), is the gas viscosity, dP is the gas pressure difference, and Δ is the distance between input and output (i.e., the Δ selected above). The gas viscosity ξ is a known value based on the particular gas being used, e.g., helium. The dP value can be estimated based on measurements of the difference in gas pressure during an imprinting/planarizing. Thus, the velocity of the gas can be determined as function of radius using the above equations.

To account for the effect of gas flow on the displacement of a drop, the drop displacement can be considered to be proportional to the gas velocity, proportional to the gas volume passed above the drop and inversely proportional to the gap between template/superstrate and substrate. The gas push on the drop and correspondingly the drop displacement should be proportional to the gas velocity and to the duration of the gas flow. The latter is proportional to the gas volume, and inverse proportional to the gap through which the flow is escaping. This can be represented by Formula (6):

$$d = k \cdot \text{Push} = k \cdot \frac{\text{Volume} \cdot \text{Velocity}}{h} \quad (6)$$

In equation (6), d is the displacement and k is a proportionality factor. The gas push is measured in the same units as the gas flow rate, volume/time. The displacement is measured in distance. Thus, the unit for k is time/area. For the specific fluid and process, the proportionality factor k needs to be found experimentally. Depending on many parameters like the template size, template thickness, template backside air pressure, gas composition (helium, air, inert gas, etc.), fluid properties and others, the proportionality factor k may be in the range of $10 \text{ s/m}^2 < k < 1{,}000 \text{ s/m}^2$. The proportionality factor k is selected in step S1404. In one example embodiment, when the maximum displacement of the observed drop displacement was 16 microns at the maximum gas flow rate of $1.6 \times 10^{-7} \text{ m}^3/\text{s}$, the selected proportionality factor k is $100 \text{ s/m}^2$. After choosing the proportionality factor k, the displacement chart can be generated using Equation (6) in step S1406. Thus, by using the above Equations (1) to (6), a displacement chart can be generated where the displacement is calculated as a function of radius.

However, to confirm that the correct proportionality factor k has been chosen, the same iterative process described in the second empirical method may be performed. That is the method may proceed with same steps of (a) step S1408 of generating an adjusted drop pattern using the displacement chart, (b) step S1410 of dispensing the drops on a substrate according to the adjusted drop pattern, (c) step S1412 of performing the imprinting/planarization, (d) step S1414 of measuring the layer thickness, and (e) step S1416 of determining if the measured layer thickness is within a predetermined threshold. If the answer to step S1416 is YES, then the proportionally factor k is correct and the method ends at step S1418. But, if the answer to step S1416 is NO, then the method return to step S1404 where a new proportionality factor k is selected and the process continues. The details of these steps are the same as discussed above with respect to steps S1314 to S1328 of FIG. 13B. That is, the same iterative process is performed.

Figure 18:
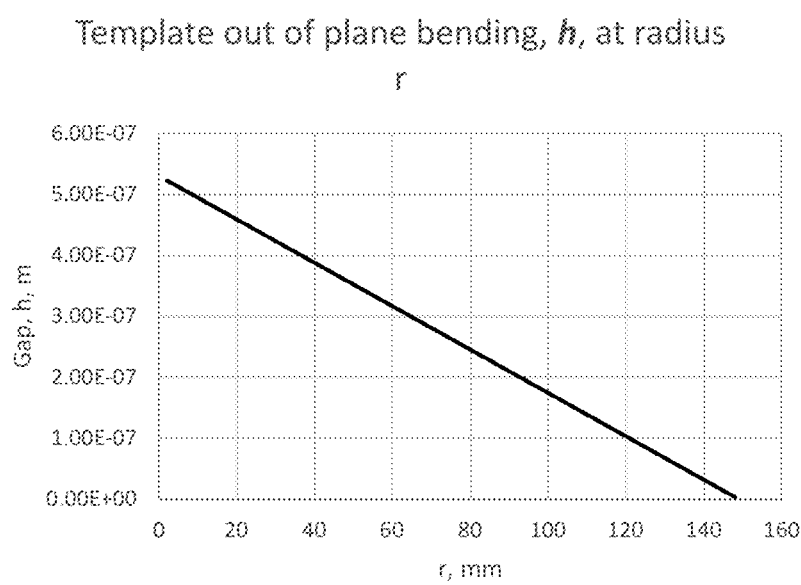
FIG. 18 is an illustration of a graph of a gap as a function of radius of an example embodiment in accordance with an example embodiment.
Figure 19:
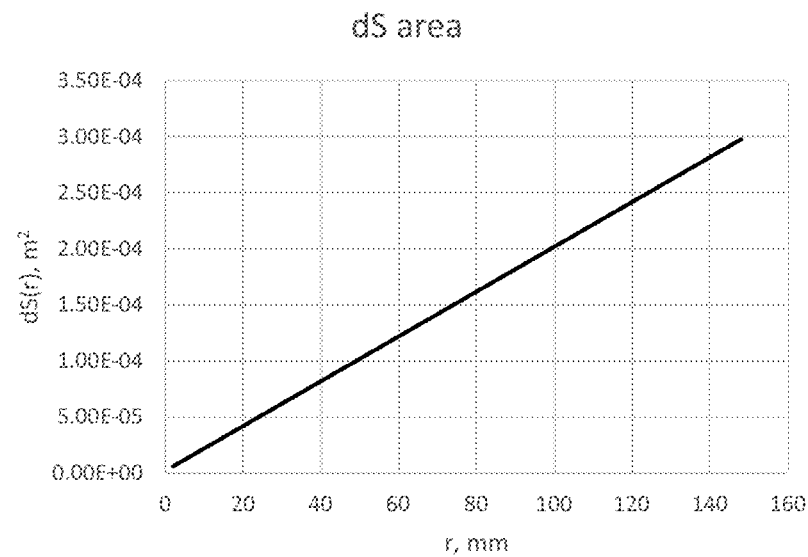
FIG. 19 is an illustration of a graph of the of an area dS as a function of radius in accordance with an example embodiment.
Figure 20:
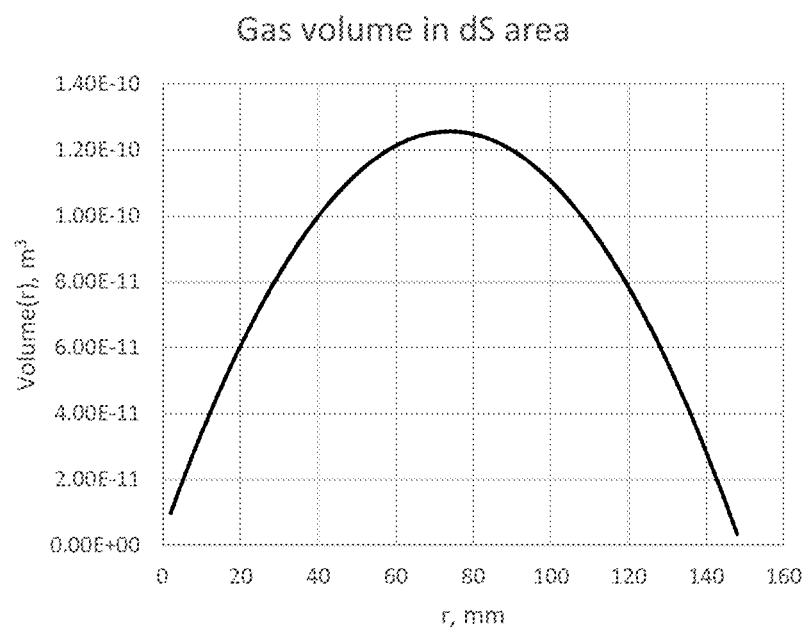
FIG. 20 is an illustration of a graph of the volume within the area dS as a function of radius in accordance with an example embodiment.
Figure 21:
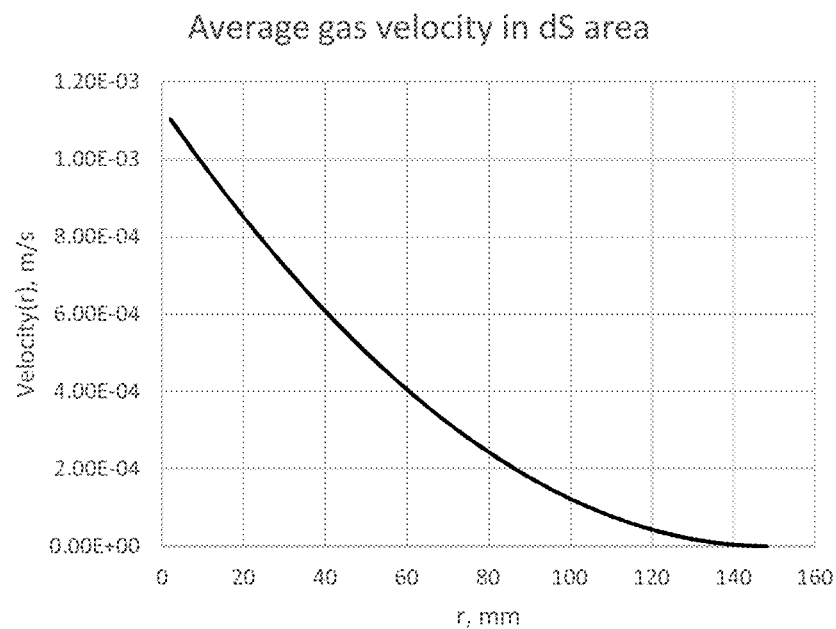
FIG. 21 is an illustration of a graph of average velocity of the gas in the area dS in accordance with an example embodiment.
Figure 22:
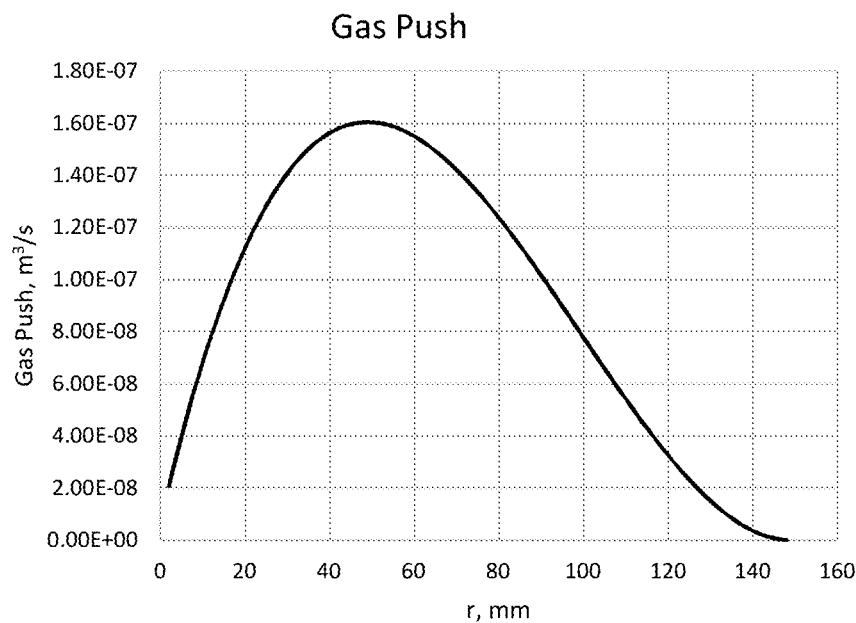
FIG. 22 is an illustration of a graph of gas push as a function of radius in accordance with an example embodiment.
Figure 23:
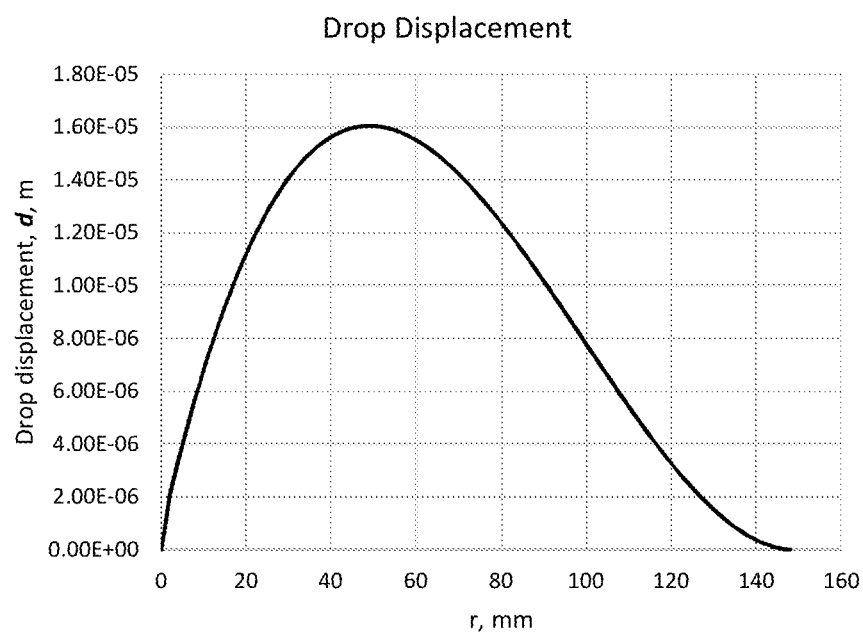
FIG. 23 is an illustration of a graph of a drop displacement as a function of radius in accordance with an example embodiment.

The following is an example embodiment of using the Equations (1) to (6). In this example embodiment, the following conditions were used: a glass template having a 300 mm diameter, template thickness t of 0.5 mm, Young's modulus E of 72 Gpa, Δ of 2 mm, template back pressure (P) of $1.9 \times 10^3$ Pa, helium gas having viscosity ξ of $1.96 \times 10^{-5}$ Pa·s, gas pressure difference dP of $1.9 \times 10^3$ Pa. FIG. 18 shows a graph of the gap h on the y-axis a function of radius r on the x-axis based when the above parameters are set using the Equations (1) to (4). As seen in FIG. 18, as the radius b increases, the gap h at a fixed A of 2 mm decreases linearly. FIG. 19 shows a graph of the of the area dS as a function of radius. As shown in FIG. 19, the area dS increases as a function of radius. FIG. 20 shows a graph of the volume within the area dS as a function of radius. As shown in FIG. 20 under the example parameters there is a maximum gas volume achieved at about 75 mm radius. FIG. 21 shows a graph of average velocity of the gas in the area dS. As seen in FIG. 21, the gas velocity reduces as the radius b increases. FIG. 22 shows a graph of the calculated gas push as a function of radius. As seen in FIG. 22, the gas push for this example embodiment ranges from 0 to $1.6 \times 10^{-7}$ m³/s which gives a proportionality factor k of $100 \text{ s/m}^2$, which is the result of step S1404. FIG. 23 shows a graph of a drop displacement, where drop displacement amount is shown a function of radius. FIG. 23 is generated using Equation (6), which is the result of step S1406. FIG. 23 is essentially a specific example embodiment of the generic displacement chart shown in FIG. 12. The displacement chart of FIG. 23 may then be used to generate an adjusted drop pattern according to step S1408 and the subsequent steps S1410 through S1418 can be performed to iteratively arrive at a final displacement chart.

Once the displacement chart has been established for a particular equipment/process/material, regardless of the particular method of generating it, the displacement chart can then be used to generate an adjusted drop pattern from the same preliminary drop pattern or any similar preliminary drop pattern using the same equipment. That is, by using the displacement chart, the particular displacement of each drop of any similar preliminary drop pattern can be determined. For example, when the spread dynamics, back template pressure, force dynamics, template pattern, wafer pattern, and feature directionality are substantially the same, the same displacement chart can be used for different drop patterns. If the template and wafer patterns are omnidirectional or isotropic given the rest of the parameters are the same, then the same displacement chart can be used. Thus, in order generate an adjusted drop pattern for a particular preliminary drop pattern, the location of each drop of the preliminary drop pattern is inputted into to the displacement chart and the corresponding outputted value of the displacement is applied to the particular drop. By doing this for each drop of the preliminary drop pattern, the adjusted drop pattern is generated. Naturally, the adjusted drop pattern is most applicable to the initial drop pattern because that is the pattern used to generate the displacement chart in the first place. In other words, in one example embodiment the initial drop pattern used to acquire the displacement chart and the preliminary drop pattern may be the same pattern, while in other embodiments the preliminary drop pattern is merely similar enough to the initial drop pattern that the displacement chart still provides acceptable results. In summary, the adjusted drop pattern is established by starting with the preliminary drop pattern, and then applying the radial adjustment to the preliminary drop pattern in accordance with displacement chart.

After the adjusted drop pattern has been established according to the above described method, the adjusted drop pattern may then be dispensed onto the substrate. Next, the method of imprinting/planarization may proceed as normal. That is, the template may then be brought down to contact the drops of the adjusted drop pattern. Due to the forces discussed above with respect to FIG. 8, the center of mass of certain drops with be displaced in a radial direction. However, because the adjusted drop pattern accounted for the forces discussed above with respect to FIG. 8, the ultimate location of the center of masses of the drops are the same as the location of the center of masses of the drops in the preliminary drop pattern, within an acceptable amount of deviation, just prior to the drops being subsumed into the continuous fluid. That is, the radial offset of each drop of the adjusted drop pattern is selected such that the displaced location (i.e., the location of the drop after the template has contacted the drops) of each drop is the same as the predetermined location of the corresponding drop of the preliminary drop pattern, within the above-noted amount of acceptable deviation. Thus, the drops end up at the desired location by dispensing the drops according to the adjusted drop pattern instead of dispensing the drops according to the preliminary drop pattern.

As noted above the processor 140 may operate based on instructions in a computer readable program stored in a non-transitory computer readable memory 142. The memory may store the displacement function H(r). The processor 140 may generate the adjusted drop pattern based on a received preliminary drop pattern. The processor 140 may then perform the imprinting/planarization as described above where the adjusted drop pattern is used in place of the preliminary drop pattern. That is, in step S302 described above, the processor 140 causes dispensing of the formable material in accordance with the adjusted drop pattern. Indeed, the processor 140 may operate to perform all of the functionality described above.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A drop dispensing method, comprising:
   providing a preliminary drop pattern that defines a predetermined location on a substrate for a center of mass of each drop of a plurality of drops, the preliminary drop pattern having a center corresponding to a center of the substrate, and the center of the substrate being located at a midpoint of a diameter of the substrate;
   adjusting the preliminary drop pattern to generate an adjusted drop pattern by radially shifting, relative to the center, each drop of a subset of drops of the plurality of drops from the predetermined location by a radial offset, each drop of the adjusted drop pattern corresponding to a drop of the preliminary drop pattern;
   dispensing the plurality of drops according to the adjusted drop pattern onto the substrate; and
   contacting a template or a superstrate with the dispensed drops, during which the center of mass of each drop of the subset of drops is radially displaced to a displaced location on the substrate prior to the plurality of drops forming a continuous layer,
   wherein the radial offset of each drop of the subset of drops is selected such that the displaced location of each drop of the subset of drops is within 50 μm of the predetermined location of the corresponding drop of the preliminary drop pattern.

2. The drop dispensing method of claim 1, further comprising:
   generating a chart of drop displacement as a function of radial drop location relative to a center of the template or superstrate,
   wherein the radial offset of each drop of the subset of drops is selected based on the drop displacement chart.

3. The drop dispensing method of claim 2, wherein generating the drop displacement chart comprises:
   providing an initial drop pattern that defines a predetermined location on a substrate for a center of mass of each drop of a plurality of initial drops;
   dispensing the plurality of initial drops according to the initial drop pattern onto the substrate;
   contacting the template or the superstrate with the dispensed initial drops, during which the center of mass of each initial drop of a subset of initial drops is radially displaced to a displaced location on the substrate prior to the plurality of initial drops forming an initial continuous layer; and
   determining the radial displacement of each initial drop of the subset of initial drops; and
   generating the drop displacement chart based on the determined radial displacement.

4. The drop dispensing method of claim 3, wherein the determining of the radial displacement of each initial drop of the subset of initial drops comprises capturing images or video of the radial displacement of each initial drop of the subset of initial drops.

5. The drop dispensing method of claim 4, wherein the determining of the radial displacement of each initial drop of the subset of initial drops comprises measuring the length of each initial drop of the subset of initial drops from the images.

6. The drop dispensing method of claim 4, wherein the determining of the radial displacement of each initial drop of the subset of initial drops comprises measuring the center of mass of each initial drop of the subset of initial drops from the images.

7. The drop dispensing method of claim 3, wherein the initial drop pattern is different from the preliminary drop pattern.

8. The drop dispensing method of claim 3, wherein the initial drop pattern is the same as the preliminary drop pattern.

9. The drop dispensing method of claim 2, wherein generating the drop displacement chart comprises:
providing an initial drop pattern that defines a predetermined location on a substrate for a center of mass of each drop of a plurality of initial drops;
dispensing the plurality of initial drops according to the initial drop pattern onto the substrate;
contacting the template or the superstrate with the dispensed initial drops, thereby spreading the plurality of drops into an initial continuous layer;
curing the initial continuous layer to form a cured material layer; and
measuring a thickness of the cured material layer at a plurality of radial locations relative to the center of the template or superstrate; and
generating the drop displacement chart based on the measured thicknesses.

10. The drop dispensing method of claim 9, wherein generating the drop displacement chart further comprises:
generating a chart of the measured thicknesses as a function of radial drop location relative to a center of the template or superstrate; and
converting the measured thicknesses chart to the drop displacement chart using a proportionality coefficient.

11. The drop dispensing method of claim 1, wherein the contacting comprises contacting the superstrate with the dispensed drops, and wherein the superstrate is featureless.

12. The drop dispensing method of claim 11, wherein the substrate is featureless.

13. The drop dispensing method of claim 1, wherein the contacting comprises contacting the template with the dispensed drops, and wherein the template comprises a patterning surface.

14. The drop dispensing method of claim 13, wherein the substrate comprises a patterned surface.

15. The drop dispensing method of claim 1, wherein the adjusting the preliminary drop pattern to generate the adjusted drop pattern further comprises rotationally shifting each drop of the subset of drops from the predetermined location by an angular offset.

16. The drop dispensing method of claim 1, wherein the radial offset of each drop of the subset of drops is selected such that the displaced location of each drop of the subset of drops is within 25 µm of the predetermined location of the corresponding drop of the preliminary drop pattern.

17. The drop dispensing method of claim 1, wherein the radial offset of each drop of the subset of drops is selected such that the displaced location of each drop of the subset of drops is within 15 µm of the predetermined location of the corresponding drop of the preliminary drop pattern.

18. The drop dispensing method of claim 1, wherein during the contacting of the template or the superstrate with the dispensed drops, the center of mass of at least one drop of the subset of drops is radially displaced by 10 µm to 200 µm.

19. The drop dispensing method of claim 1, further comprising:
determining, for each drop of the preliminary drop pattern, a radial displacement amount resulting from contacting the template or the superstrate with drops dispensed according to the preliminary drop pattern,
wherein the radial offset of each drop of the subset of drops is selected based on the determined radial displacement.

20. A method of generating a drop pattern, comprising:
providing a preliminary drop pattern that defines a predetermined location on a substrate for a center of mass of each drop of a plurality of drops, the preliminary drop pattern having a center corresponding to a center of the substrate, and the center of the substrate being located at a midpoint of a diameter of the substrate; and
adjusting the preliminary drop pattern to generate an adjusted drop pattern by radially shifting, relative to the center, each drop of a subset of drops of the plurality of drops from the predetermined location by a radial offset, each drop of the adjusted drop pattern corresponding to a drop of the preliminary drop pattern,
wherein the radial offset of each drop of the subset of drops is selected such that
when the plurality of drops is dispensed onto the substrate according to the adjusted drop pattern, and
when a template or superstrate is contacted with the dispensed drops, during which the center of the mass of each drop of the subset of drops is radially displaced to a displaced location on the substrate prior to the plurality of drops forming a continuous layer,
the displaced location of each drop of the subset of drops is within 50 µm of the predetermined location of the corresponding drop of the preliminary drop pattern.

21. A method of making an article, comprising:
providing a preliminary drop pattern that defines a predetermined location on a substrate for a center of mass of each drop of a plurality of drops, the preliminary drop pattern having a center corresponding to a center of the substrate, and the center of the substrate being located at a midpoint of a diameter of the substrate;
adjusting the preliminary drop pattern to generate an adjusted drop pattern by radially shifting, relative to the center, each drop of a subset of drops of the plurality of drops from the predetermined location by a radial offset, each drop of the adjusted drop pattern corresponding to a drop of the preliminary drop pattern;
dispensing the plurality of drops according to the adjusted drop pattern onto the substrate;
contacting a template or a superstrate with the dispensed drops, during which the center of mass of each drop of the subset of drops is radially displaced to a displaced location on the substrate prior to the dispensed drops combining to form a pattern or a layer;
forming the pattern or the layer of the plurality of dispensed drops on the substrate as a result of completing the contacting of the template or superstrate with the dispensed drops; and processing the formed pattern or layer to make the article,
wherein the radial offset of each drop of the subset of drops is selected such that the displaced location of each drop of the subset of drops is within 50 μm of the predetermined location of the corresponding drop of the preliminary drop pattern.

* * * * *